US012757583B2

(12) United States Patent
Kweon et al.

(10) Patent No.: US 12,757,583 B2
(45) Date of Patent: Oct. 6, 2026

(54) DISPLAY PANEL AND METHOD OF MANUFACTURING THE SAME

(71) Applicant: Samsung Display Co., Ltd., Yongin-Si (KR)

(72) Inventors: Dae-Gi Kweon, Yongin-si (KR); Yongho Yang, Yongin-si (KR); Minjeong Park, Yongin-si (KR); Illhwan Lee, Yongin-si (KR); Chang-Ho Jeong, Yongin-si (KR); Junyoung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 364 days.

(21) Appl. No.: 18/611,701

(22) Filed: Mar. 21, 2024

(65) Prior Publication Data

US 2024/0334750 A1 Oct. 3, 2024

(30) Foreign Application Priority Data

Apr. 3, 2023 (KR) ........................ 10-2023-0043375

(51) Int. Cl.

| | |
|---|---|
| ***H10K 59/122*** | (2023.01) |
| ***H10K 59/12*** | (2023.01) |
| ***H10K 71/60*** | (2023.01) |
| *H10K 102/00* | (2023.01) |

(52) U.S. Cl.

CPC ....... *H10K 59/122* (2023.02); *H10K 59/1201* (2023.02); *H10K 71/60* (2023.02); *H10K 2102/311* (2023.02)

(58) Field of Classification Search

CPC .. H10K 59/122; H10K 59/1201; H10K 71/60; H10K 2102/311; H10K 50/11; H10K 59/35; H10K 59/8051; H10K 59/8052; H10K 71/00

See application file for complete search history.

(56) References Cited

U.S. PATENT DOCUMENTS

| | | | |
|---|---|---|---|
| 10,983,436 B2 | 4/2021 | Tanigaki et al. | |
| 11,309,372 B2 | 4/2022 | Choi et al. | |
| 2017/0278914 A1* | 9/2017 | Cui | H10K 50/11 |
| 2018/0366524 A1* | 12/2018 | Bang | H10K 59/80521 |

FOREIGN PATENT DOCUMENTS

| | | |
|---|---|---|
| KR | 10-1888941 B1 | 8/2018 |
| KR | 10-2067968 B1 | 1/2020 |
| KR | 10-2318807 B1 | 10/2021 |
| KR | 10-2413500 B1 | 6/2022 |

* cited by examiner

*Primary Examiner* — Karen Kusumakar

(74) *Attorney, Agent, or Firm* — Innovation Counsel LLP

(57) ABSTRACT

A display panel is disclosed that includes a base layer including a first pixel area and a second pixel area adjacent to the first pixel area, a pixel definition layer disposed on the base layer and provided with a pixel opening defined therethrough to correspond to each of the first pixel area and the second pixel area, and a first electrode of which at least a portion is disposed in the pixel opening. The pixel definition layer includes a first slant portion, a second slant portion spaced apart from the first slant portion, a first convex portion disposed between the first slant portion and the second slant portion and adjacent to the first slant portion, and a first flat portion disposed between the first slant portion and the second slant portion and adjacent to the second slant portion.

20 Claims, 20 Drawing Sheets

DISPLAY PANEL AND METHOD OF MANUFACTURING THE SAME

This U.S. non-provisional patent application claims priority under 35 U.S.C. § 119 of Korean Patent Application No. 10-2023-0043375, filed on Apr. 3, 2023, the contents of which are hereby incorporated by reference in its entirety.

BACKGROUND

1. Field of Disclosure

The present disclosure relates to a display panel and a method of manufacturing the same. More particularly, the present disclosure relates to a display panel having improved brightness and a method of manufacturing the display panel.

2. Description of the Related Art

Electronic devices providing a user with images, such as smartphones, tablet computers, digital cameras, notebook computers, navigation units, and televisions, include a display device to display the images.

The display device includes red, green, and blue pixels, and a light emitting layer having a color corresponding to a color of each pixel is disposed in each pixel. In general, the light emitting layer is formed through a deposition process using a shadow mask, but defects, such as a sagging of the mask, are likely to occur. In recent, a process of entirely and commonly forming the light emitting layer and other organic layers over each pixel using an open mask is being developed.

However, when the organic layer is commonly formed, a lateral leakage current occurs in the organic layer commonly formed over the pixels adjacent to each other, and a color mixture and a brightness defect occur.

SUMMARY

The present disclosure may provide a display panel capable of preventing a driving voltage from excessively increasing, a color mixture from occurring, and a brightness from being lowered.

The present disclosure may provide a method of manufacturing the display panel.

Embodiments of the inventive concept provide a display panel including a base layer including a first pixel area and a second pixel area adjacent to the first pixel area, a pixel definition layer disposed on the base layer and including a pixel opening defined therethrough to correspond to the first pixel area and the second pixel area, respectively, a first electrode of which at least a portion is disposed in the pixel opening. The pixel definition layer includes a first slant portion, a second slant portion spaced apart from the first slant portion, a first convex portion disposed between the first slant portion and the second slant portion and adjacent to the first slant portion, and a first flat portion disposed between the first slant portion and the second slant portion and adjacent to the second slant portion. The first slant portion includes a first slant surface inclined at a first angle with respect to an upper surface of the base layer, the second slant portion includes a second slant surface inclined at a second angle with respect to the upper surface of the base layer, and the first angle is greater than the second angle.

The pixel definition layer includes a first closed portion disposed along a periphery of the first pixel area, including the first convex portion, and surrounding a portion of the first pixel area and a first opened portion that does not include the first convex portion and includes a portion of the first pixel area, which is not surrounded by the first closed portion, and a circumference length of the first opened portion is about 20% or more and about 30% or less of a sum of the circumference length of the first opened portion and a circumference length of the first closed portion.

The pixel definition layer further includes a spacer disposed on the first flat portion.

The first angle is equal to or greater than about 70° and equal to or less than about 130°, and the second angle is equal to or greater than about 10° and equal to or less than about 40°.

A step difference between the first convex portion and the first flat portion is equal to or greater than about 0.2 micrometers and equal to or less than about 1.0 micrometers, and the first convex portion has a width equal to or greater than about 2.5 micrometers and equal to or less than about 4.5 micrometers.

The base layer further includes a third pixel area adjacent to the second pixel area, the first pixel area displays a first light, the second pixel area displays a second light having a wavelength different from the first light, and the third pixel area displays a third light having a wavelength different from the first light and the second light.

The display panel further includes an organic layer disposed on the first electrode and the pixel definition layer and including a light emitting layer and a second electrode disposed on the organic layer.

The organic layer includes an organic first slant portion disposed on the first slant surface, an organic first convex portion disposed on the first convex portion, an organic first flat portion disposed on the first flat portion, and an organic second slant portion disposed on the second slant surface. The second electrode includes an electrode first slant portion disposed on the organic first slant portion, an electrode first convex portion disposed on the organic first convex portion, an electrode first flat portion disposed on the organic first flat portion, and an electrode second slant portion disposed on the organic second slant portion.

The organic first slant portion has a thickness of about 10% or more and about 30% or less of a thickness of the organic first flat portion or the organic second slant portion.

The organic layer further includes a hole control layer disposed on the first electrode and the pixel definition layer, the light emitting layer disposed on the hole control layer, and an electron control layer disposed between the light emitting layer and the second electrode.

The first slant portion is disposed adjacent to the first pixel area, and the second slant portion is disposed adjacent to the second pixel area.

The pixel definition layer further includes a third slant portion facing the first slant portion and including a third slant surface inclined at a third angle with respect to the upper surface of the base layer and a fourth slant portion spaced apart from the second slant portion with the first slant portion and the third slant portion interposed therebetween and including a fourth slant surface inclined at a fourth angle with respect to the upper surface of the base layer, and the third angle is greater than the fourth angle.

The third angle is equal to or greater than about 70° and equal to or less than about 130°, and the fourth angle is equal to or greater than about 10° and equal to or less than about 40°.

The pixel definition layer further includes a second convex portion disposed between the third slant portion and the fourth slant portion and adjacent to the third slant portion, and a separation distance between the first convex portion and the second convex portion is equal to or greater than about 4 micrometers and equal to or less than about 6 micrometers.

The pixel definition layer further includes a third slant portion facing the first slant portion and including a third slant surface inclined at a third angle with respect to the upper surface of the base layer and a fourth slant portion spaced apart from the second slant portion with the first slant portion and the third slant portion interposed therebetween and including a fourth slant surface inclined at a fourth angle with respect to the upper surface of the base layer, and each of the third and fourth angles is greater than the second angle.

Embodiments of the inventive concept provide a display panel including a base layer including a first pixel area and a second pixel area adjacent to the first pixel area, a pixel definition layer disposed on the base layer and including a pixel opening defined therethrough to correspond to the first pixel area and the second pixel area, respectively, a first electrode of which at least a portion is disposed in the pixel opening, an organic layer disposed on the first electrode and the pixel definition layer and including a light emitting layer, and a second electrode disposed on the organic layer. The pixel definition layer includes a first slant portion including a first slant surface inclined at a first angle with respect to an upper surface of the base layer and a second slant portion spaced apart from the first slant portion and including a second slant surface inclined at a second angle with respect to the upper surface of the base layer. The first angle is greater than the second angle, the organic layer includes an organic first slant portion disposed on the first slant surface and an organic second slant portion disposed on the second slant surface, the second electrode includes an electrode first slant portion disposed on the organic first slant portion and an electrode second slant portion disposed on the organic second slant portion, and the organic first slant portion has a thickness smaller than a thickness of the organic second slant portion.

The pixel definition layer further includes a first convex portion disposed between the first slant portion and the second slant portion and adjacent to the first slant portion and a first flat portion disposed between the first slant portion and the second slant portion and adjacent to the second slant portion, the organic layer further includes an organic first convex portion disposed on the first convex portion and an organic first flat portion disposed on the first flat portion, and the second electrode further includes an electrode first convex portion disposed on the organic first convex portion and an electrode first flat portion disposed on the organic first flat portion.

The organic first slant portion has a thickness of about 10% or more and about 30% or less of a thickness of the organic first flat portion or the organic second slant portion.

Embodiments of the inventive concept provide a method of manufacturing a display panel. The manufacturing method of the display panel includes preparing a base layer, forming a first electrode on the base layer, providing a negative photoresist that covers the first electrode to form a preliminary pixel definition layer, providing a mask including a first portion in which a first exposure non-transmissive portion, a first exposure transmissive portion, and a first exposure semi-transmissive portion are arranged in one direction and a second portion in which a second exposure transmissive portion, a second exposure semi-transmissive portion, and a second exposure non-transmissive portion are arranged in the one direction on the preliminary pixel definition layer, exposing the preliminary pixel definition layer to a light through the mask, and removing portions of the preliminary pixel definition layer except portions cured by the exposure process to form the pixel definition layer. The pixel definition layer includes a first slant portion formed corresponding to the first exposure non-transmissive portion of the mask, a first convex portion formed corresponding to the first exposure transmissive portion of the mask, a first flat portion formed corresponding to the first exposure semi-transmissive portion of the mask, a spacer formed corresponding to the second exposure transmissive portion of the mask, and a second slant portion formed corresponding to the second exposure semi-transmissive portion of the mask, the first slant portion includes a first slant surface inclined at a first angle with respect to an upper surface of the base layer, the second slant portion is spaced apart from the first slant portion and includes a second slant surface inclined at a second angle with respect to the upper surface of the base layer, the first convex portion is disposed between the first slant portion and the second slant portion and disposed adjacent to the first slant portion, the first flat portion is disposed between the first slant portion and the second slant portion and disposed adjacent to the second slant portion, and the first angle is greater than the second angle.

The first angle is equal to or greater than about 70° and equal to or less than about 130°, and the second angle is equal to or greater than about 10° and equal to or less than about 40°.

According to the display panel of the present disclosure, the angle formed between the slant surface of the portion of the pixel definition layer and the base layer increases, and thus, a portion of the organic layer and a portion of the second electrode, which are to be deposited, have a relatively thinner thickness. Accordingly, a lateral leakage current is prevented.

According to the method of manufacturing the display panel of the present disclosure, the pixel definition layer is formed using the mask in which the arrangement of an exposure transmissive portion, an exposure semi-transmissive portion, and an exposure non-transmissive portion in one part of mask is different from that of the other part of the mask. Accordingly, the manufacturing process becomes simplified, and productivity and yield are improved compared with a conventional manufacturing method.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
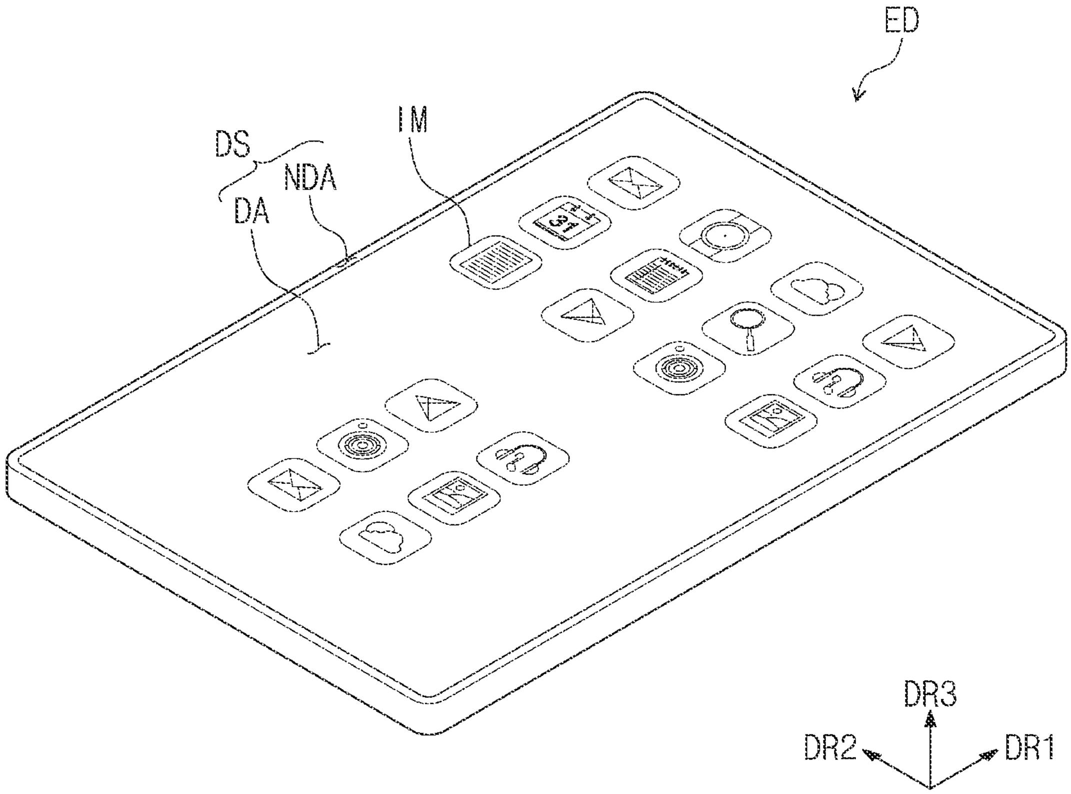
FIG. 1 is an assembled perspective view of an electronic device according to an embodiment of the present disclosure.

Hereinafter, embodiments of the present disclosure will be described with reference to accompanying drawings.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include", "including", "comprise", and "comprising", when used in this specification, specify the presence of stated features, integers, steps, operations, elements, and components, but do not preclude the presence or addition of one or more other features, integers, steps, operations, elements, components, and groups thereof.

Meanwhile, in the present disclosure, when an element is referred to as being "directly connected" to another element, there are no intervening elements present between a layer, film region, or substrate and another layer, film, region, or substrate. For example, the term "directly connected" may mean that two layers or two members are disposed without employing additional adhesive therebetween.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to an embodiment of the present disclosure will be described with reference to accompanying drawings.

Figure 2:
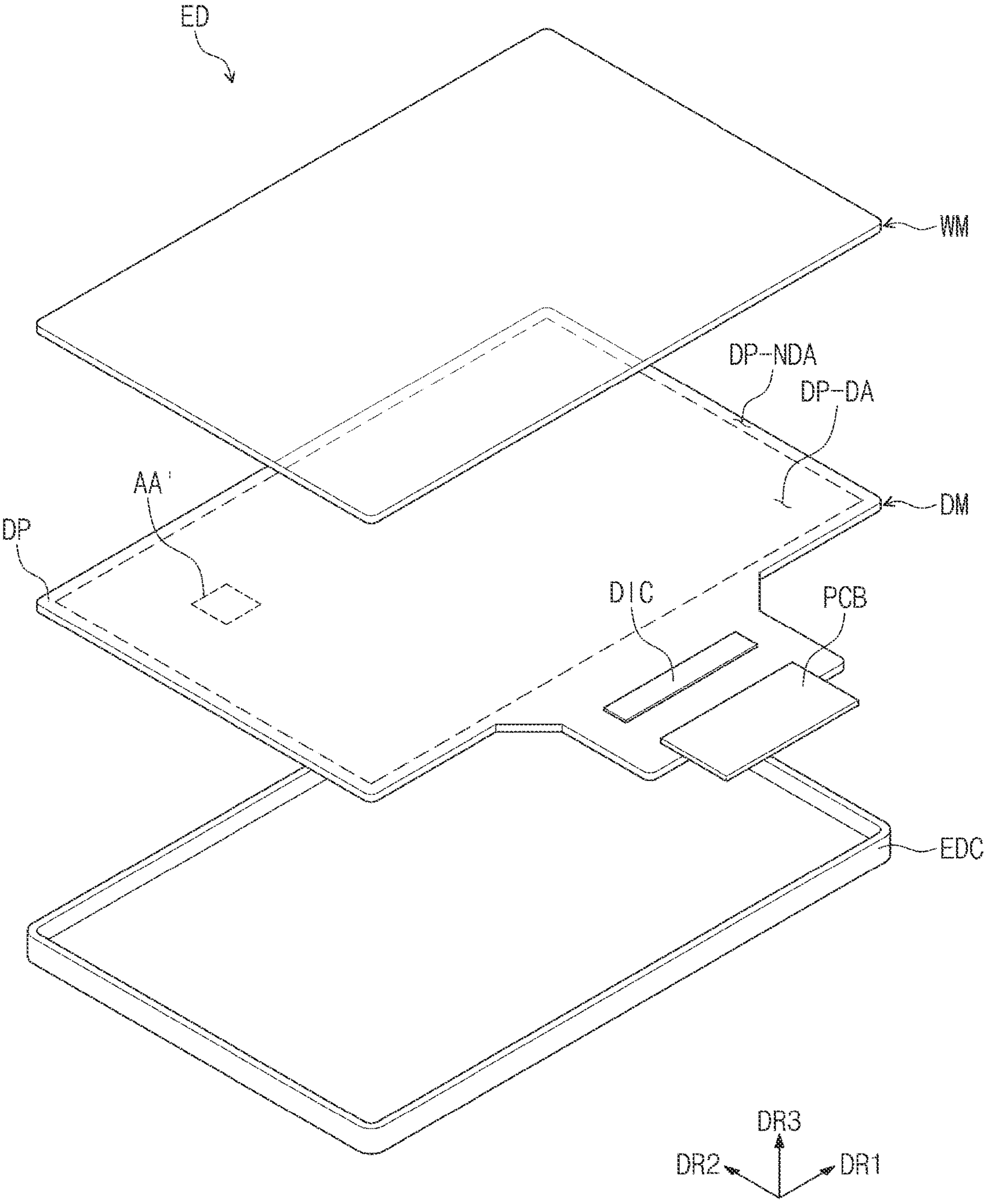
FIG. 2 is an exploded perspective view of an electronic device according to an embodiment of the present disclosure.

FIG. 1 is an assembled perspective view of an electronic device ED according to an embodiment of the present disclosure. FIG. 2 is an exploded perspective view of the electronic device ED according to an embodiment of the present disclosure.

Referring to FIG. 1, the electronic device ED may be a device activated in response to an electrical signal. The electronic device ED may display an image IM and may sense an external input. The electronic device ED may include various embodiments. For example, the electronic device ED may be a tablet computer, a notebook computer, a computer, a smart phone, or a television. In the present embodiment, a tablet computer will be described as a representative example of the electronic device ED, however, it should not be limited thereto or thereby. As shown in FIGS. 3A to 3C and 4, the electronic device ED may be a smart phone. According to an embodiment, the electronic device ED may be applied to a large-sized display device, such as a notebook computer, a monitor, or a television.

The electronic device ED may display the image IM through a display surface DS, which is substantially parallel to each of a first direction DR1 and a second direction DR2, toward a third direction DR3. The display surface DS through which the image IM is displayed may correspond to a front surface of the electronic device ED and a front surface of a window WM. Hereinafter, the display surface and the front surface of the electronic device ED and the front surface of the window WM will be assigned with the same reference numeral. The image IM may include a still image as well as a video. FIG. 1 shows a plurality of application icons as a representative example of the image IM.

In the present embodiment, front (or upper) and rear (or lower) surfaces of each member of the electronic device ED may be defined with respect to a direction in which the image IM is displayed. The front and rear surfaces may be opposite to each other in the third direction DR3, and a normal line direction of each of the front and rear surfaces may be substantially parallel to the third direction DR3. A separation distance in the third direction DR3 between the front surface and the rear surface may correspond to a thickness or a height in the third direction DR3 of the electronic device ED. Meanwhile, directions indicated by the first, second, and third directions DR1, DR2, and DR3 may be relative to each other and may be changed to other directions. In the following descriptions, the expression "when viewed in a plane" may mean a state of being viewed in the plane defined by the first direction DR1 and the second direction DR2.

The electronic device ED may sense a user input applied thereto from the outside. The user input may include various types of external inputs, such as a part of the user's body, light, heat, and pressure. In addition, the electronic device ED may sense the user input applied to a side or rear surface of the electronic device ED depending on its structure and should not be limited to a specific embodiment.

As shown in FIG. 2, the electronic device ED may include the window WM, a display module DM, and an external case EDC. In the present embodiment, the window WM may be coupled with the external case EDC to form an exterior of the electronic device ED. The external case EDC, the display module DM, and the window WM may be sequentially stacked in the third direction DR3.

The window WM may include an optically transparent material. The window WM may include an insulating panel. As an example, the window WM may include a glass, plastic, or combination thereof.

As described above, the front surface DS of the window WM may define the front surface of the electronic device ED.

The window WM may include a transmissive area and a bezel area. The transmissive area may be an optically transparent area. For example, the transmissive area may have a transmittance of about 90% or more with respect to a visible light.

The bezel area may have a light transmittance relatively lower than that of the transmissive area. The bezel area may define a shape of the transmissive area. The bezel area may be defined adjacent to the transmissive area and may surround the transmissive area. The bezel area may have a predetermined color. The bezel area may overlap a non-display area DP-NDA of a display panel DP described later. The bezel area may cover the non-display area DP-NDA of the display panel DP to prevent the non-display area DP-NDA from being viewed from the outside, however, this is merely an example. According to an embodiment, the bezel area may be omitted from the window WM.

The display module DM may include at least the display panel DP. FIG. 2 shows only the display panel DP among components of the display module DM, however, the display module DM may further include a plurality of components disposed on and under the display panel DP. The detailed stack structure of the display module DM will be described later.

The display panel DP may include a display area DP-DA and the non-display area DP-NDA, which respectively correspond to a display area DA (refer to FIG. 1) and a non-display area NDA (refer to FIG. 1) of the electronic device ED. In the present disclosure, the expression "An area/portion corresponds to another area/portion." means that "An area/portion overlaps another area/portion.", however, the "areas and portions" should not be limited to having the same size as each other. The display module DM may include a driving chip DIC disposed in the non-display area DP-NDA. The display module DM may further include a printed circuit board PCB coupled with the display panel DP in the non-display area DP-NDA. The printed circuit board PCB may be electrically connected to pads arranged in the non-display area DP-NDA of the display panel DP by an anisotropic adhesive layer.

The driving chip DIC may include driving elements to drive pixels of the display panel DP, e.g., a data driving circuit. FIG. 2 shows a structure in which the driving chip DIC is mounted on the display panel DP, however, the present disclosure should not be limited thereto or thereby. As an example, the driving chip DIC may be mounted on the printed circuit board PCB.

The external case EDC may accommodate the display module DM and may be coupled with the window WM. The external case EDC may protect components accommodated therein, such as the display module DM.

Figure 3A:
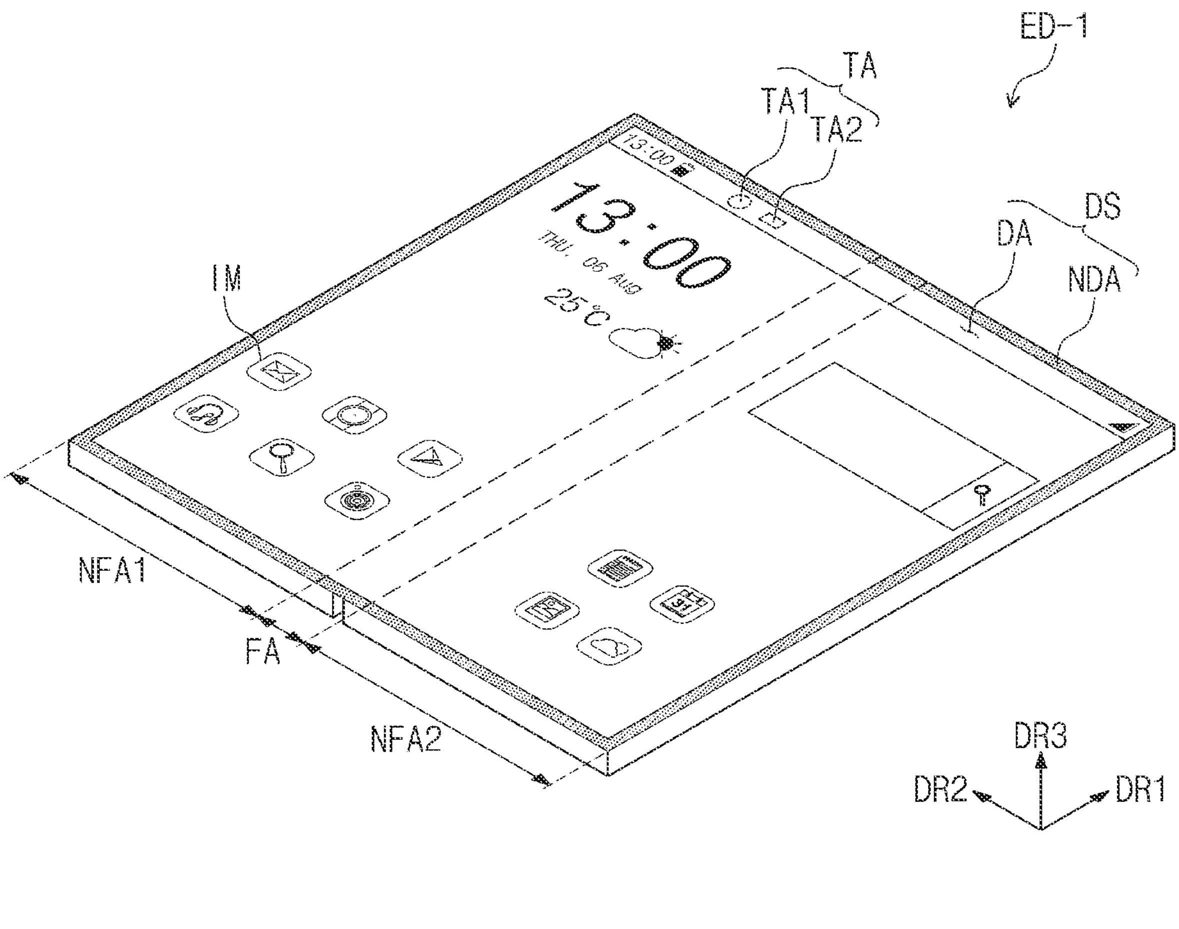
FIGS. 3A, 3B, and 3C are perspective views of an electronic device according to an embodiment of the present disclosure.
Figure 3B:
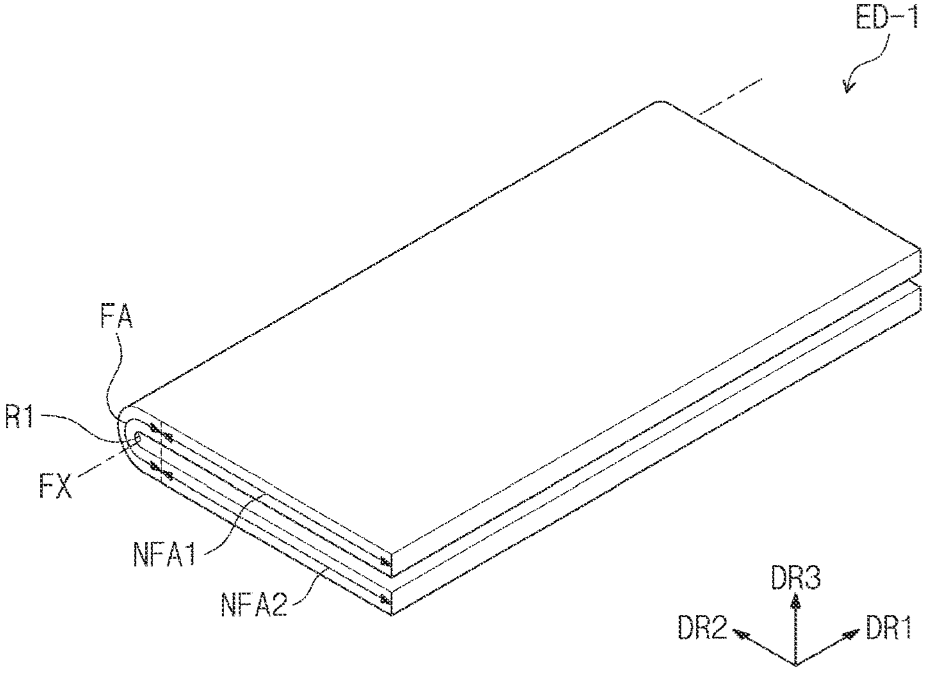
Figure 3C:
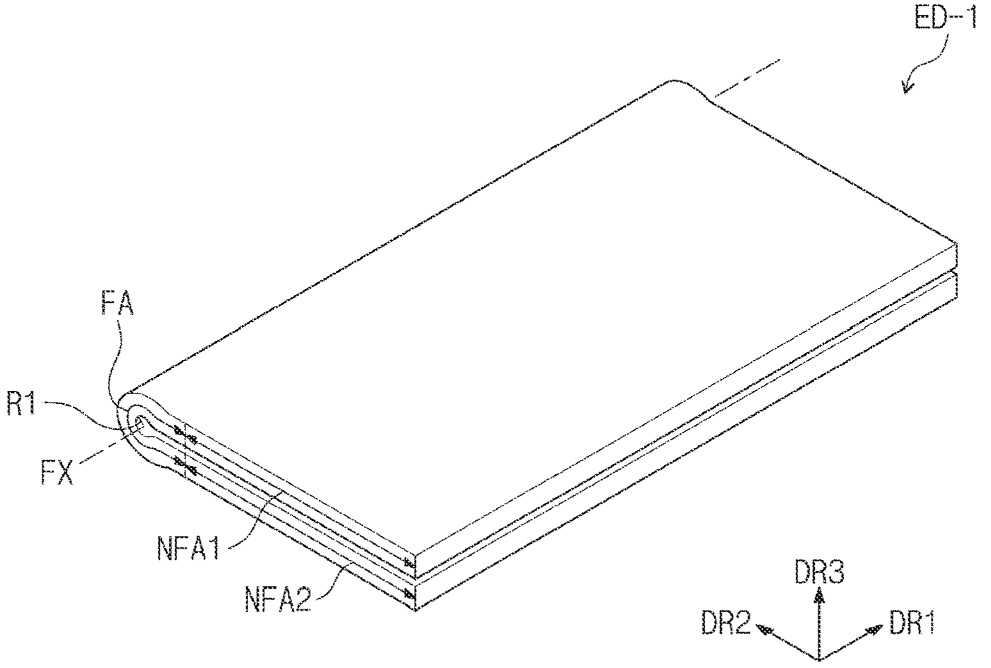
Figure 4:
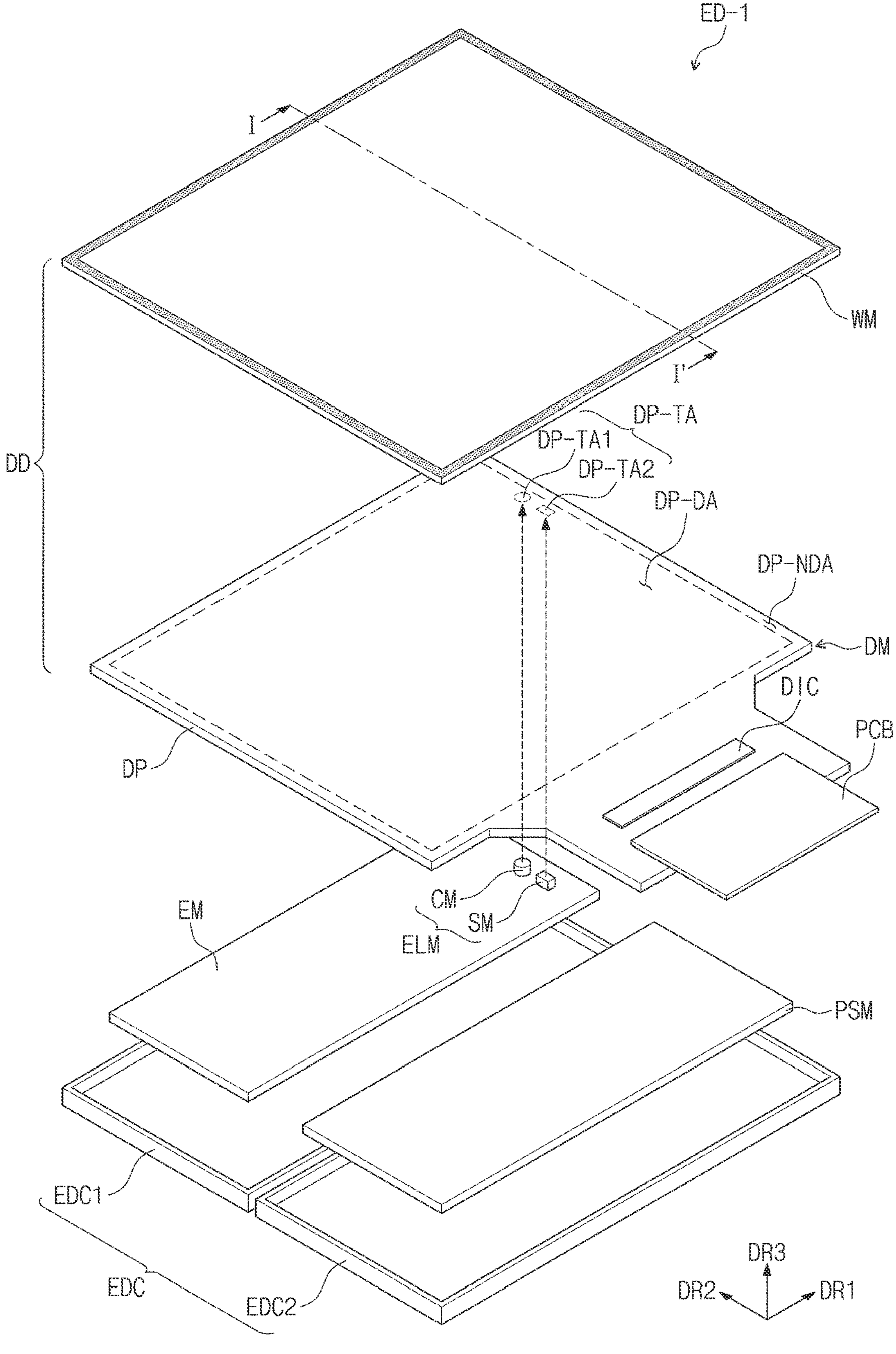
FIG. 4 is an exploded perspective view of an electronic device according to an embodiment of the present disclosure.

FIGS. 3A to 3C are perspective views of an electronic device ED-1 according to an embodiment of the present disclosure. FIG. 4 is an exploded perspective view of the electronic device ED-1 according to an embodiment of the present disclosure. FIG. 3A shows the electronic device ED-1 in an unfolded state, and FIGS. 3B and 3C show the electronic device ED-1 in a folded state.

Referring to FIGS. 3A to 3C, the electronic device ED-1 may include a display surface DS defined by the first direction DR1 and the second direction DR2 intersecting the first direction DR1. The electronic device ED-1 may provide an image IM to a user through the display surface DS.

The display surface DS may include a display area DA and a non-display area NDA around the display area DA. The display area DA may display the image IM, and the non-display area NDA may not display the image IM. The non-display area NDA may surround the display area DA, however, it should not be limited thereto or thereby, and the shape of the display area DA and the shape of the non-display area NDA may be changed.

According to the electronic device ED-1, the display surface DS may further include a signal transmission area TA. The signal transmission area TA may be a part of the display area DA or a part of the non-display area NDA. As shown in FIG. 3A, the signal transmission area TA may be the part of the display area DA. The signal transmission area TA may have a transmittance higher than that of the display area DA and the non-display area NDA. A natural light, a visible light, or an infrared light may travel through the signal transmission area TA. The electronic device ED-1 may further include a camera module that takes a picture of an external object using the visible light traveling through the signal transmission area TA or a sensor module that determines an approach of the external object using the infrared light.

Different from the electronic device ED-1 shown in FIG. 3A, according to an embodiment, the signal transmission area TA may not be spaced apart from the non-display area NDA and may extend from the non-display area NDA. The signal transmission area TA may be provided in plural.

The electronic device ED-1 may include a folding area FA and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2 on the second direction DR2.

As shown in FIG. 3B, the folding area FA may be folded with respect to a folding axis FX substantially parallel to the first direction DR1. The folding area FA may have a predetermined curvature and a radius of curvature R1 when the electronic device ED-1 is in the folded state. The electronic device ED-1 may be inwardly folded (inner-folding) such that the first non-folding area NFA1 faces the second non-folding area NFA2 and the display surface DS is not exposed to the outside.

According to an embodiment, the electronic device ED-1 may be outwardly folded (outer-folding) such that the display surface DS is exposed to the outside. According to an embodiment, the electronic device ED-1 may be configured to repeat the unfolding operation and the in-folding operation or to repeat the unfolding operation and the out-folding operation, however, the present disclosure should not be limited thereto or thereby. According to an embodiment, the electronic device ED-1 may be selectively operated in any one of the unfolding operation, the in-folding operation, and the out-folding operation.

As shown in FIG. 3B, a distance between the first non-folding area NFA1 and the second non-folding area NFA2 may be substantially the same as the radius of curvature R1, however, as shown in FIG. 3C, the distance between the first non-folding area NFA1 and the second non-folding area NFA2 may be smaller than the radius of curvature R1. The electronic device ED-1 shown in FIGS. 3B and 3C are illustrated based on the display surface DS, and an external case EDC (refer to FIG. 4) defining the appearance of the electronic device ED-1 may be in contact with edge areas of the first non-folding area NFA1 and the second non-folding area NFA2.

Meanwhile, FIGS. 3A to 3C show the structure in which the electronic device ED-1 includes two non-folding areas NFA1 and NFA2 and one folding area FA disposed therebetween as a representative example, however, the present disclosure should not be limited thereto or thereby. For example, the electronic device ED-1 may include a plurality of folding areas and may be folded multiple times.

As shown in FIG. 4, the electronic device ED-1 may include a display device DD, a control module EM, a power source module PSM, an electronic module ELM, and the external case EDC. Although not shown in figures, the external case EDC may further include a hinge structure to control a folding operation of the display device DD.

The display device DD may generate an image IM and may sense an external input. The display device DD may include a window WM and a display module DM. The window WM may provide a front surface of the electronic device ED-1. Details of the display module DM and the window WM described with reference to FIG. 2 may be applied to the display module DM and the window WM of FIG. 4.

According to the electronic device ED-1, a display panel DP may further include a signal transmission area DP-TA. The signal transmission area DP-TA may be an opening or may be an area having a lower resolution than that of a display area DP-DA. Consequently, the signal transmission area DP-TA may have a transmittance higher than the display area DP-DA and a non-display area DP-NDA. The signal transmission area DP-TA of the display panel DP may correspond to the signal transmission area TA (refer to FIG. 3A) of the electronic device ED-1. The signal transmission area DP-TA may include a first signal transmission area DP-TA1 corresponding to a camera module CM and a second signal transmission area DP-TA2 corresponding to a sensor module SM.

The external case EDC may accommodate the display module DM, the control module EM, the power supply module PSM, and the electronic module ELM. The external case EDC may include two cases EDC1 and EDC2 separated from each other, however, it should not be limited thereto or thereby. Although not shown in figure, the electronic device ED-1 may further include a hinge structure to connect the two cases EDC1 and EDC2. The external case EDC may be coupled with the window WM. The external case EDC may protect the display module DM, the control module EM, the power supply module PSM, and the electronic module ELM, which are accommodated in the external case EDC.

The electronic module ELM may be an electronic part that outputs or receives an optical signal. The electronic module ELM may transmit or receive the optical signal through a portion of the electronic device ED-1 corresponding to the signal transmission area TA (refer to FIG. 3A). In the present embodiment, the electronic module ELM may include the camera module CM. The camera module CM may receive a natural light signal through the first signal transmission area DP-TA1 to take the photo of the external object. The electronic module ELM may include the sensor module SM, such as a proximity sensor or an infrared emission sensor. The sensor module SM may recognize a part of a user's body, e.g., a fingerprint, an iris, or a face, or may measure a distance between an object and a mobile phone through the second signal transmission area DP-TA2.

The electronic module ELM may be disposed under the display device DD. The electronic module ELM may be disposed to correspond to the signal transmission area TA (refer to FIG. 3A) of the electronic device ED-1. That is, the electronic module ELM may overlap the signal transmission area DP-TA of the display panel DP. The signal transmission area DP-TA of the display panel DP may have a high light transmittance compared with other areas of the display panel DP.

The power supply module PM may supply a power source necessary for an overall operation of the electronic device ED-1. The power supply module PM may include a well-known battery module.

Figure 5:
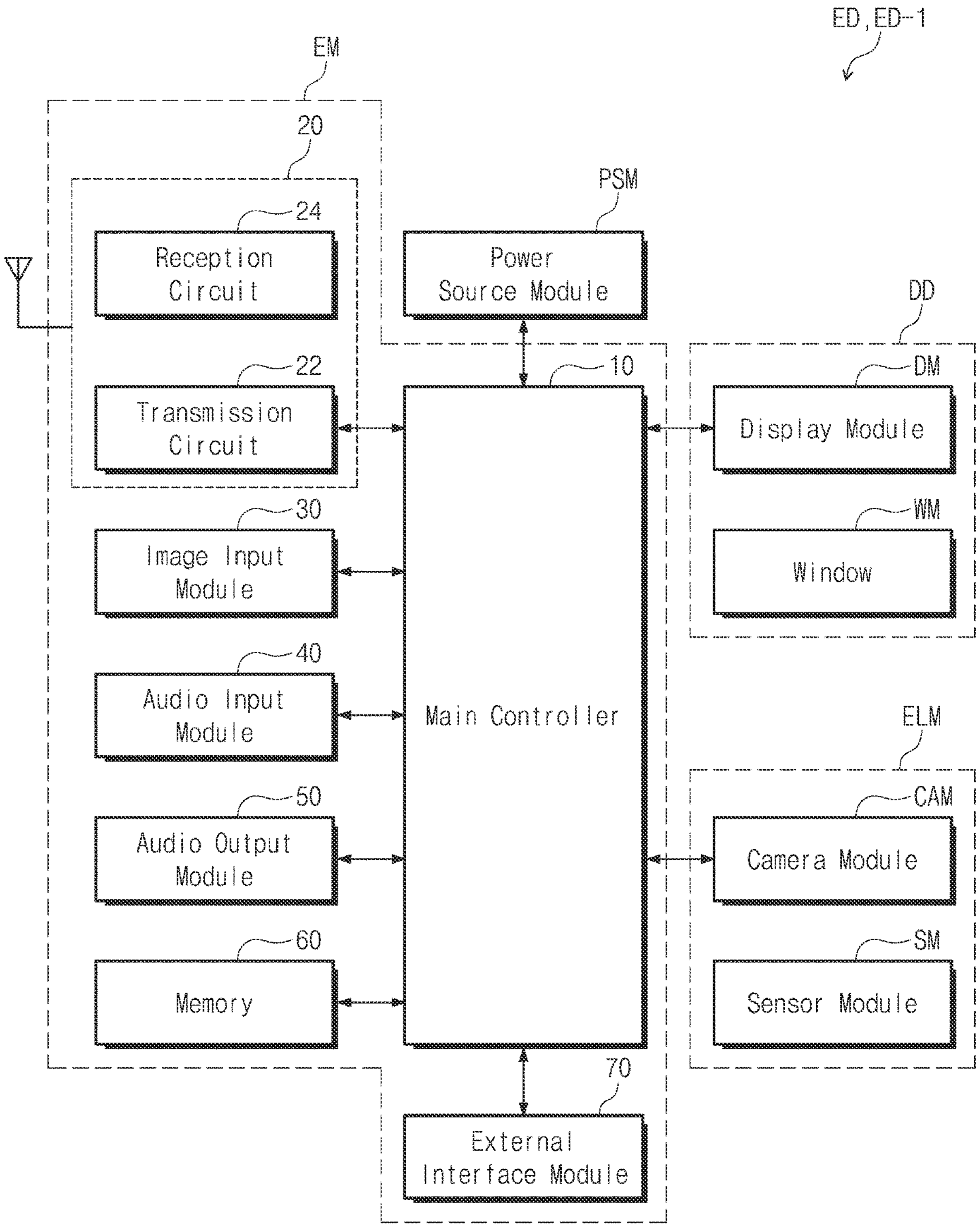
FIG. 5 is a block diagram of an electronic device according to an embodiment of the present disclosure.

FIG. 5 is a block diagram of the electronic devices ED and ED-1 according to an embodiment of the present disclosure. FIG. 5 is a block diagram schematically showing components of the electronic devices ED and ED-1. In FIG. 5, the same reference numerals denote the same elements in FIGS. 1 to 4, and thus, detailed descriptions of the same elements will be omitted.

The control module EM may include at least a main controller 10. The control module EM may include the main controller 10, a wireless communication module 20, an image input module 30, an audio input module 40, an audio output module 50, a memory 60, and an external interface module 70. The modules may be mounted on a circuit board to be electrically connected to each other or may be electrically connected to each other through a flexible circuit board. The control module EM may be electrically connected to the power supply module PSM.

The main controller 10 may control an overall operation of the electronic devices ED and ED-1. As an example, the main controller 10 may activate or deactivate the display device DD in response to the user input. The main controller 10 may control other modules, such as the image input module 30, the audio input module 40, the audio output module 50, or the like, in response to the user input. The main controller 10 may include at least one microprocessor.

The wireless communication module 20 may transmit/receive a wireless signal to/from other terminals using a Bluetooth or WiFi link. The wireless communication module 20 may transmit/receive a voice signal using a general communication line. The wireless communication module 20 may include a transmission circuit 22 that modulates a signal to be transmitted and transmits the modulated signal and a reception circuit 24 that demodulates the signal applied thereto.

The image input module 30 may process an image signal and may convert the image signal into image data that may be displayed through the display device DD. The audio input module 40 may receive an external sound signal through a microphone in a record mode or a voice recognition mode and may convert the external sound signal to electrical voice data. The audio output module 50 may convert sound data provided thereto from the wireless communication module 20 or sound data stored in the memory 60 and may output the converted sound data to the outside.

The external interface module 70 may serve as an interface between the main controller 10 and external devices, such as an external charger, a wired/wireless data port, a card socket (e.g., a memory card and a SIM/UIM card), etc.

Figure 6A:
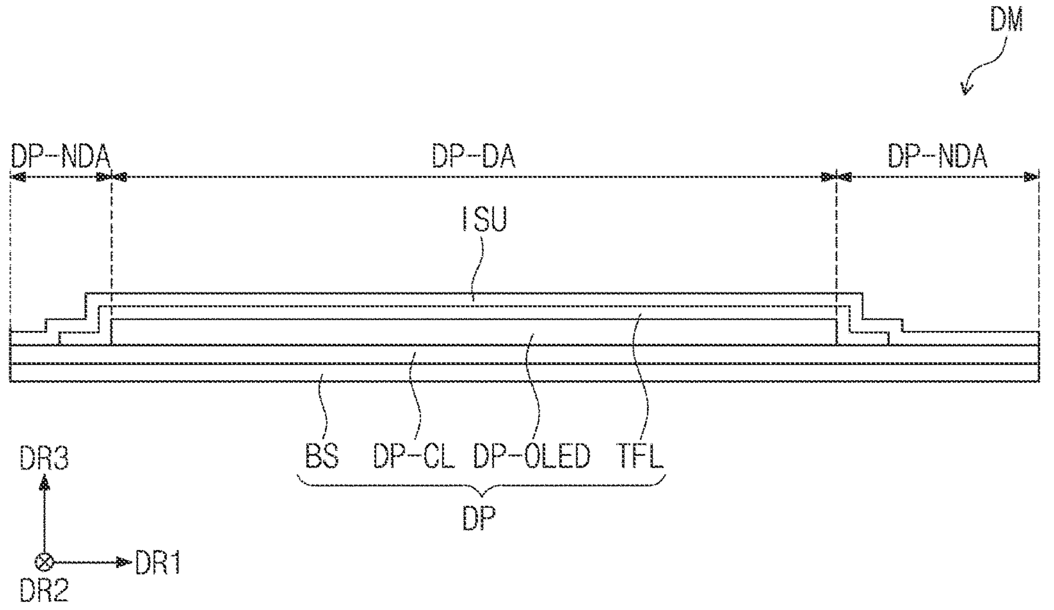
FIG. 6A is a cross-sectional view of a display module according to an embodiment of the present disclosure.
Figure 6B:
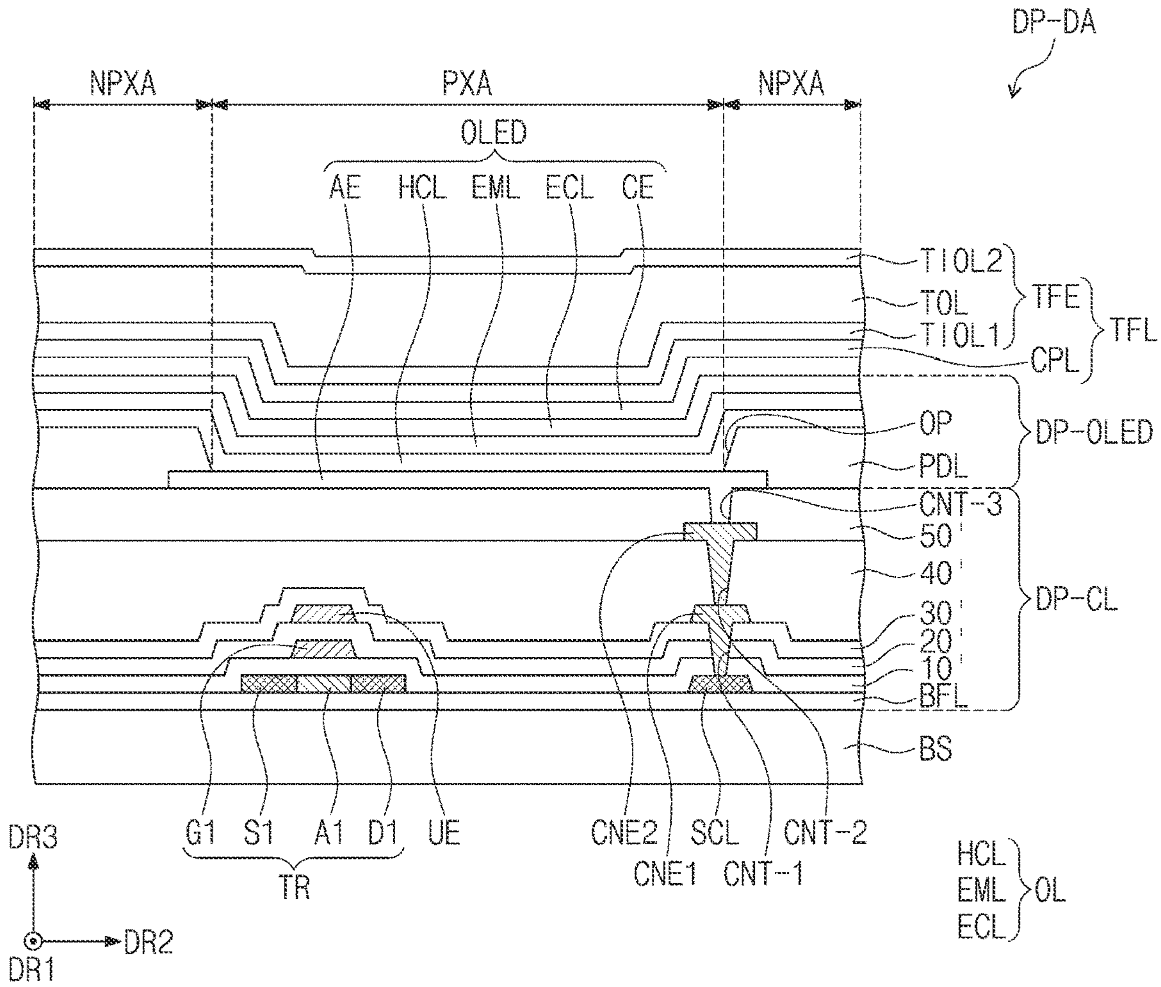
FIG. 6B is a cross-sectional view of a portion of a display panel included in a display module according to an embodiment of the present disclosure.
Figure 6C:
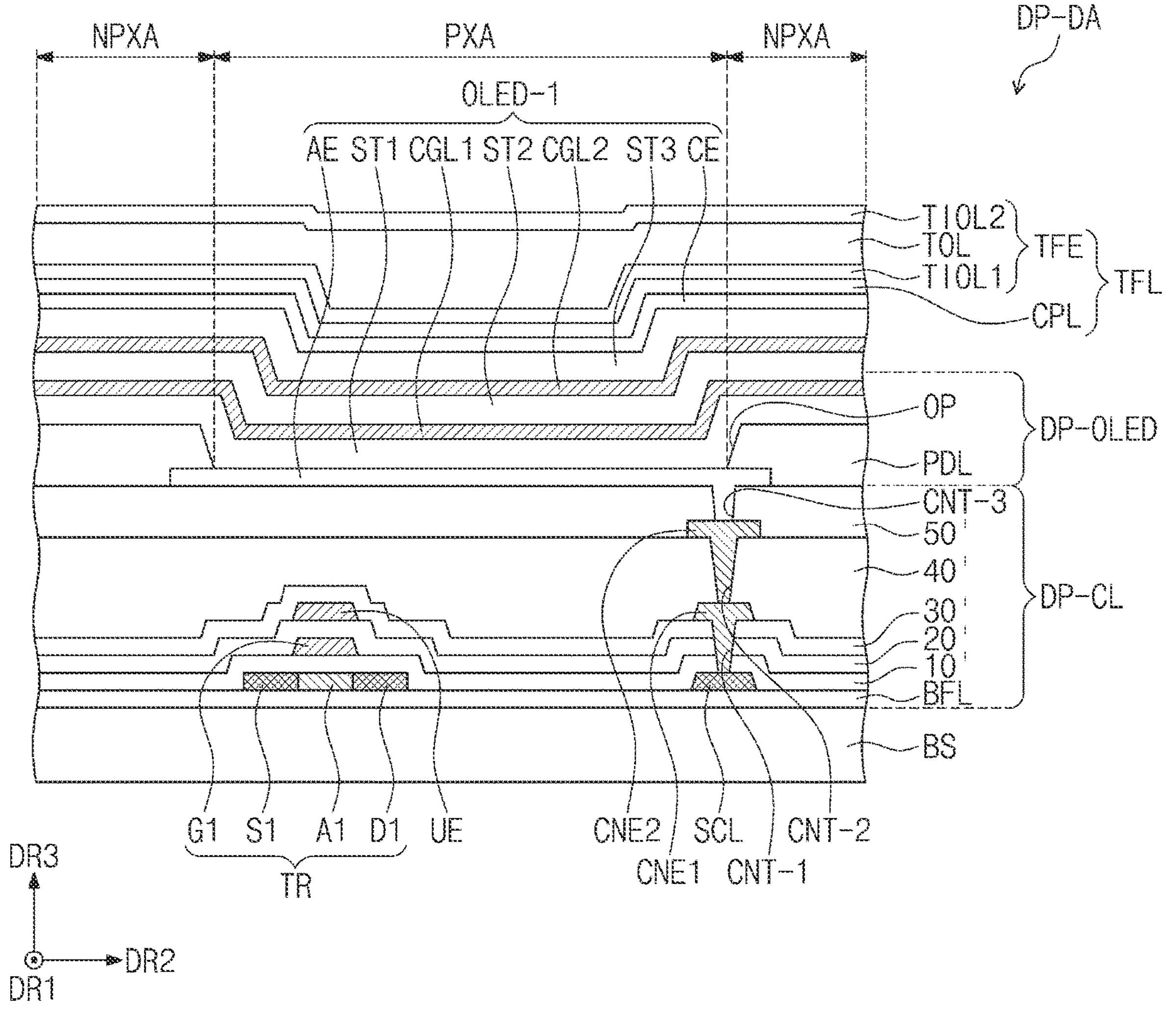
FIG. 6C is a cross-sectional view of a portion of a display panel according to an embodiment of the present disclosure.

FIG. 6A is a cross-sectional view of the display module DM according to an embodiment of the present disclosure. FIG. 6B is a cross-sectional view of a portion of the display panel included in the display module according to an embodiment of the present disclosure. FIG. 6C is a cross-sectional view of a portion of a display panel according to an embodiment of the present disclosure. In FIGS. 6B and 6C, a light emitting element and a transistor, which are included in the pixel of the display panel, are shown as a representative example.

Referring to FIG. 6A, the display module DM may include the display panel DP and an input sensing unit ISU. The display panel DP may have configurations to generate the image IM (refer to FIGS. 1 and 3A). The image IM (refer to FIGS. 1 and 3A) generated by the display panel DP may be viewed from the outside by the user through the display area DA (refer to FIGS. 1 and 3A).

The display panel DP may be a light-emitting type display panel, however, it should not be particularly limited. For instance, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot, a quantum rod, or a micro-LED. Hereinafter, the organic light emitting display panel will be described as a representative example of the display panel DP.

The input sensing unit ISU may be disposed on the display panel DP. The input sensing unit ISU may sense the external input applied thereto from the outside. The external input may include a variety of inputs provided from the outside of the electronic device ED (refer to FIG. 1). As an example, the external inputs may include a proximity input (e.g., hovering) applied when approaching close to or adjacent to the electronic device ED at a predetermined distance as well as a touch input by a part of the user's body (e.g., the user's hand). In addition, the external inputs may be provided in the form of force, pressure, light, etc., and it should not be particularly limited.

The input sensing unit ISU may be formed on the display panel DP through successive processes. In this case, the input sensing unit ISU may be disposed directly on the display panel DP. In the following descriptions, the expression "A component B is disposed directly on a component A." means that no intervening elements are present between the component A and the component B. That is, a separate adhesive member may not be disposed between the input sensing unit ISU and the display panel DP.

The display panel DP may include a base layer BS, a circuit element layer DP-CL, a display element layer DP-OLED, and an upper insulating layer TFL. The circuit element layer DP-CL, the display element layer DP-OLED, and the upper insulating layer TFL may be disposed on the base layer BS.

The base layer BS may provide a base surface on which the circuit element layer DP-CL, the display element layer DP-OLED, and the upper insulating layer TFL are stacked. The base layer BS may be a rigid substrate or a flexible substrate that is bendable, foldable, or rollable. The base layer BS may be a glass substrate, a metal substrate, or a polymer substrate, however, it should not be limited thereto or thereby. According to an embodiment, the base layer BS may include an inorganic layer, an organic layer, or a composite material layer.

The base layer BS may have a multi-layer structure. For instance, the base layer BS may include a first synthetic resin layer, an inorganic layer having a single-layer or multi-layer structure, and a second synthetic resin layer disposed on the inorganic layer having a single-layer or multi-layer structure. Each of the first and second synthetic resin layers may include a polyimide-based resin, however, it should not be particularly limited.

The circuit element layer DP-CL may be disposed on the base layer BS. The circuit element layer DP-CL may include a plurality of insulating layers, a plurality of conductive layers, and a semiconductor layer. The conductive layers of the circuit element layer DP-CL may form signal lines or a control circuit of a pixel.

The display element layer DP-OLED may be disposed on the circuit element layer DP-CL. The display element layer DP-OLED may include light emitting elements. For example, the display element layer DP-OLED may include organic light emitting elements, however, this is merely an example. According to an embodiment, the display element layer DP-OLED may include inorganic light emitting elements, organic-inorganic light emitting elements, or a liquid crystal layer.

The upper insulating layer TFL may include a capping layer and a thin film encapsulation layer, which are described later. The upper insulating layer TFL may include an organic layer and a plurality of inorganic layers to encapsulate the organic layer.

The upper insulating layer TFL may be disposed on the display element layer DP-OLED and may protect the display element layer DP-OLED from moisture, oxygen, and a foreign substance such as dust particles. The upper insulating layer TFL may encapsulate the display element layer DP-OLED to prevent moisture and oxygen from entering the display element layer DP-OLED. The upper insulating layer TFL may include at least one inorganic layer. The upper insulating layer TFL may include an organic layer and a plurality of inorganic layers encapsulating the organic layer. The upper insulating layer TFL may include a stack structure in which an inorganic layer, an organic layer, and an inorganic layer are sequentially stacked.

The input sensing unit ISU may be disposed on the upper insulating layer TFL. The input sensing unit ISU may be formed on the upper insulating layer TFL through successive processes. The input sensing unit ISU may be disposed directly on the display panel DP. That is, a separate adhesive member may not be disposed between the input sensing unit ISU and the display panel DP. The input sensing unit ISU may be disposed to make contact with an inorganic layer disposed at an uppermost position of the upper insulating layer TFL.

Although not shown in figures, the display module DM may further include a protective member disposed on a lower surface of the display panel DP and an anti-reflective member disposed on an upper surface of the input sensing unit ISU. The anti-reflective member may reduce a reflectance of the display module DM with respect to the external light. The anti-reflective member may be disposed directly on the input sensing unit ISU through successive processes.

The anti-reflective member may include light blocking patterns overlapping a reflective structure disposed thereunder. The anti-reflective member may further include a color filter. The color filter may be disposed between the light blocking patterns and may include a first color filter, a second color filter, and a third color filter, which respectively correspond to a first color pixel, a second color pixel, and a third color pixel.

As shown in FIG. 6A, the display panel DP may include the display area DP-DA and the non-display area DP-NDA when viewed in the plane. The display area DP-DA of the display panel DP may be an area through which an image is displayed, and the non-display area DP-NDA of the display panel DP may be an area in which a driving circuit or a driving line is disposed. The light emitting elements of the pixels may be arranged in the display area DP-DA. The display area DP-DA may overlap at least a portion of the transmissive area of the window WM (refer to FIG. 2), and the non-display area DP-NDA may be covered by the bezel area of the window WM. The display area DP-DA and the non-display area DP-NDA of the display panel DP may respectively correspond to the display area DA and the non-display area NDA of the electronic device ED shown in FIG. 1.

Referring to FIGS. 6A and 6B, the display panel DP may include the circuit element layer DP-CL, the display element layer DP-OLED, and the upper insulating layer TFL, which are sequentially stacked on the base layer BS. The circuit element layer DP-CL, the display element layer DP-OLED, and the upper insulating layer TFL will be described in detail with reference to FIG. 6B.

The circuit element layer DP-CL may include at least one insulating layer and a circuit element. The circuit element may include a signal line and a pixel driving circuit. The circuit element layer DP-CL may be formed by a coating or depositing process to form an insulating layer, a semiconductor layer, and a conductive layer and a photolithography process to pattern the insulating layer, the semiconductor layer, and the conductive layer.

A buffer layer BFL may include a plurality of inorganic layers stacked one on another. A semiconductor pattern may be disposed on the buffer layer BFL. The buffer layer BFL may increase a coupling force between the base layer BS and the semiconductor pattern.

The semiconductor pattern may include polysilicon, however, it should not be limited thereto or thereby. The semiconductor pattern may include an amorphous silicon or metal oxide. FIG. 6B shows a portion of the semiconductor pattern, and the semiconductor pattern may be further disposed in other areas of the pixel when viewed in the plane. The semiconductor pattern may be arranged with a specific rule over the plurality of pixels PX.

The semiconductor pattern may have different electrical properties depending on whether it is doped or not or whether it is doped with an N-type dopant or a P-type dopant. The semiconductor pattern may include a first region A1 with low doping concentration and low conductivity and second regions S1 and D1 with relatively high doping concentration and high conductivity. One second region S1 may be disposed at one side of the first region A1, and the other second region S2 may be disposed at the other side of the first region A1. The second regions S1 and D1 may be doped with the N-type dopant or the P-type dopant. A P-type transistor may include a doped region doped with the P-type dopant. The first region A1 may be a non-doped region or may be doped at a concentration lower than the second regions S1 and D1.

The second regions S1 and D1 may substantially serve as an electrode or a signal line. The one second area S1 may correspond to a source of a transistor, and the other second area D1 may correspond to a drain of the transistor. FIG. 6B shows a portion of a connection signal line SCL formed of the semiconductor pattern. Although not shown in figures, the connection signal line SCL may be connected to the drain of the transistor TR when viewed in a plane.

A first insulating layer 10' may be disposed on the buffer layer BFL. The first insulating layer 10' may commonly overlap the pixels arranged in the display area DP-DA and may cover the semiconductor pattern. The first insulating layer 10' may be an inorganic layer or an organic layer and may have a single-layer or multi-layer structure (e.g., an inorganic layer and an organic layer). The first insulating layer 10' may include at least one of aluminum oxide, titanium oxide, silicon oxide, silicon oxynitride, zirconium oxide, and hafnium oxide. Not only the first insulating layer 10' but also each of other insulating layers of the circuit element layer DP-CL described later may be an inorganic layer or an organic layer and may have a single-layer or multi-layer structure.

A gate G1 may be disposed on the first insulating layer 10'. The gate G1 may be a portion of a metal pattern. The gate G1 may overlap the first region A1. The gate G1 may be used as a mask in a process of doping the semiconductor pattern.

A second insulating layer 20' may be disposed on the first insulating layer 10' and may cover the gate G1. The second insulating layer 20' may commonly overlap the pixels. An upper electrode UE may be disposed on the second insulating layer 20'. The upper electrode UE may overlap the gate G1. The upper electrode UE may include a plurality of metal layers. According to an embodiment, the upper electrode UE may be omitted.

A third insulating layer 30' may be disposed on the second insulating layer 20' and may cover the upper electrode UE. A first connection electrode CNE1 may be disposed on the third insulating layer 30'. The first connection electrode CNE1 may be connected to the connection signal line SCL via a contact hole CNT-1 defined through the first, second, and third insulating layers 10', 20', and 30'.

A fourth insulating layer 40' may be disposed on the third insulating layer 30', and a fifth insulating layer 50' may be disposed on the fourth insulating layer 40'. The fourth insulating layer 40' may be an organic layer. A second connection electrode CNE2 may be disposed on the fourth insulating layer 40'. The second connection electrode CNE2 may be connected to the first connection electrode CNE1 via a contact hole CNT-2 defined through the fourth insulating layer 40'.

The fifth insulating layer 50' may be disposed on the fourth insulating layer 40' and may cover the second connection electrode CNE2. The fifth insulating layer 50' may be an organic layer.

The light emitting element OLED may be disposed on the fifth insulating layer 50'. A first electrode AE may be disposed on the fifth insulating layer 50'. The first electrode AE may be connected to the second connection electrode CNE2 via a contact hole CNT-3 defined through the fifth insulating layer 50'. A pixel definition layer PDL may be provided with a pixel opening OP defined therethrough. At least a portion of the first electrode AE may be exposed through the pixel opening OP of the pixel definition layer PDL. The pixel definition layer PDL may be an organic layer.

As shown in FIG. 6B, the display area DP-DA may include a pixel area PXA and a non-pixel area NPXA adjacent to the pixel area PXA. The non-pixel area NPXA may surround the pixel area PXA. In the present embodiment, the pixel area PXA may be defined to correspond to the portion of the first electrode AE, which is exposed through the pixel opening OP.

A hole control layer HCL may be commonly disposed in the pixel area PXA and the non-pixel area NPXA. The hole control layer HCL may include a hole transport layer and may further include a hole injection layer. A light emitting layer EML may be disposed on the hole control layer HCL.

An electron control layer ECL may be disposed on the light emitting layer EML. The electron control layer ECL may include an electron transport layer and may further include an electron injection layer. The hole control layer HCL, the light emitting layer EML, and the electron control layer ECL may be commonly disposed over the pixels using an open mask, however, the present disclosure should not be limited thereto or thereby. According to an embodiment, at least one of the hole control layer HCL, the light emitting layer EML, and the electron control layer ECL may be formed through a patterning process using a mask. As an example, the light emitting layer EML may be disposed in an area corresponding to the pixel opening OP. That is, the light emitting layer EML may be divided into plural portions respectively disposed in the pixels. The hole control layer HCL, the light emitting layer EML, and the electron control layer ECL may be referred to as an organic layer OL.

A second electrode CE may be disposed on the electron control layer ECL. The second electrode CE may have an integral shape and may be commonly disposed over the pixels.

The upper insulating layer TFL may be disposed on the display element layer DP-OLED and may include a plurality of thin layers. According to an embodiment, the upper insulating layer TFL may include a capping layer CPL and an encapsulation layer TFE disposed on the capping layer CPL. The capping layer CPL may be disposed on the second electrode CE and may be in contact with the second electrode CE. The capping layer CPL may include an organic material.

The encapsulation layer TFE may include a first inorganic encapsulation layer TIOL1, an organic encapsulation layer TOL, and a second inorganic encapsulation layer TIOL2. The first inorganic encapsulation layer TIOL1 and the second inorganic encapsulation layer TIOL2 may protect the display element layer DP-OLED from moisture and oxygen, and the organic encapsulation layer TOL may protect the display element layer DP-OLED from a foreign substance such as dust particles.

FIG. 6C shows a portion of the display panel including a light emitting element OLED-1 different from the light emitting element OLED shown in FIG. 6B. In FIG. 6C, the same reference numerals denote the same elements in FIG. 6B, and thus, detailed descriptions of the same elements will be omitted.

Referring to FIG. 6C, the light emitting element OLED-1 included in the display panel may include a plurality of light emitting stacks ST1, ST2, and ST3, and charge generation layers CGL1 and CGL2 disposed between the light emitting stacks ST1, ST2, and ST3. The light emitting element OLED-1 may include a first electrode AE, a first light emitting stack ST1, a first charge generation layer CGL1, a second light emitting stack ST2, a second charge generation layer CGL2, a third light emitting stack ST3, and a second electrode CE, which are sequentially stacked. Meanwhile, FIG. 6C shows the structure in which the light emitting element OLED-1 includes three light emitting stacks ST1, ST2, and ST3 and two charge generation layers CGL1 and CGL2 disposed between the three light emitting stacks ST1, ST2, and ST3, however, the present disclosure should not be limited thereto or thereby. According to an embodiment, the light emitting element OLED-1 may include two light emitting stacks or four or more light emitting stacks.

Each of the light emitting stacks ST1, ST2, and ST3 may include the light emitting layer EML (refer to FIG. 6B), the hole control layer HCL (refer to FIG. 6B), and the electron control layer ECL (refer to FIG. 6B) spaced apart from the hole control layer HCL (refer to FIG. 6B) with the light emitting layer EML (refer to FIG. 6B) interposed therebetween. According to an embodiment, the first light emitting stack ST1 may include a first light emitting layer, the second light emitting stack ST2 may include a second light emitting layer, and the third light emitting stack ST3 may include a third light emitting layer. That is, the light emitting element OLED-1 may be a light emitting element having a tandem structure including the light emitting stacks with the light emitting layers.

The light emitting stacks ST1, ST2, and ST3 shown in FIG. 6C may emit lights having the same wavelength as each other. As an example, the light emitted from each of the light emitting stacks ST1, ST2, and ST3 may be a blue light, however, the present disclosure should not be limited thereto or thereby. According to an embodiment, the lights emitted from the light emitting stacks ST1, ST2, and ST3 may have different wavelength ranges from each other. As an example, at least one of the light emitting stacks ST1, ST2, and ST3 may emit the blue light, and the other stacks of the light emitting stacks ST1, ST2, and ST3 may emit a green light. The light emitting element OLED-1 including the light emitting stacks ST1, ST2, and ST3 emitting the lights having different wavelength ranges from each other may emit a white light.

The charge generation layers CGL1 and CGL2 may be disposed between the light emitting stacks ST1, ST2, and ST3 adjacent to each other. Each of the charge generation layers CGL1 and CGL2 may include a p-type charge generation layer or an N-type charge generation layer. The N-type charge generation layer may provide electrons to the stacks adjacent thereto. The N-type charge generation layer may be obtained by doping a base material with an n-dopant. The P-type charge generation layer may provide holes to the stacks adjacent thereto. A buffer layer may be further disposed between the N-type charge generation layer and the P-type charge generation layer.

When a voltage is applied, the charge generation layers CGL1 and CGL2 may form a complex through an oxidation-reduction reaction, and thus may generate charges (electrons and holes). In addition, the charge generation layers CGL1 and CGL2 may provide the generated charges to each of the light emitting stacks ST1, ST2, and ST3 adjacent thereto. The charge generation layers CGL1 and CGL2 may double the efficiency of current generated in the light emitting stacks ST1, ST2, and ST3 and may adjust a balance of the charges between the light emitting stacks ST1, ST2, and ST3 adjacent to each other.

Figure 7A:
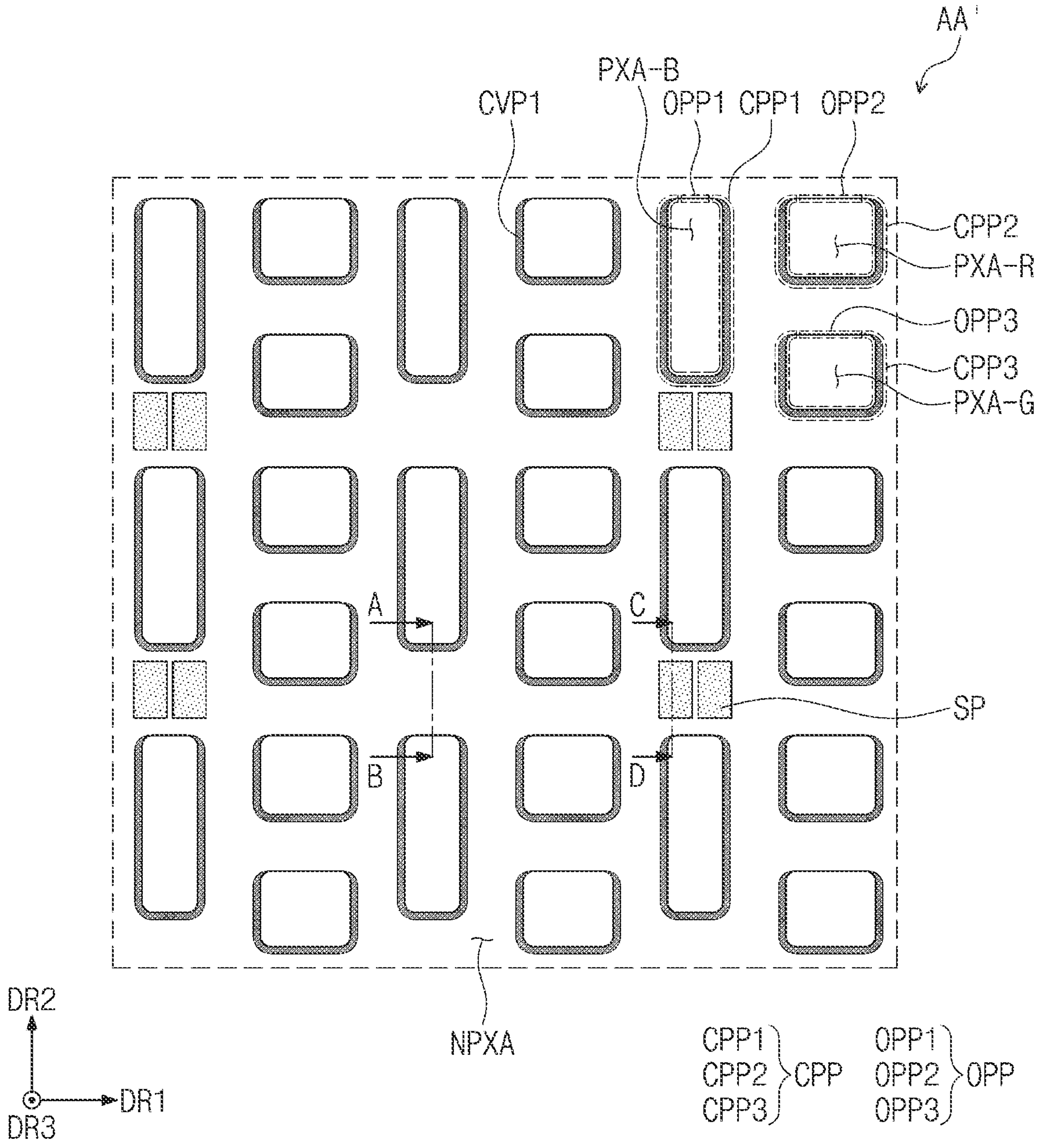
FIG. 7A is a plan view of a portion of a display panel according to an embodiment of the present disclosure.

FIG. 7A is a plan view of a portion of the display panel according to an embodiment of the present disclosure. FIG. 7A is a plan view of AA', a portion of the display panel shown in FIG. 2. FIG. 7A shows an arrangement of the pixels and a first convex portion CVP1 adjacent to the pixels.

Referring to FIGS. 2 and 7A, the display area DP-DA of the display panel DP may include pixel areas PXA-B, PXA-R, and PXA-G and a non-pixel area NPXA surrounding the pixel areas PXA-B, PXA-R, and PXA-G. The pixel areas PXA-B, PXA-R, and PXA-G may include a first pixel area PXA-B, a second pixel area PXA-R, and a third pixel area PXA-G. The first pixel area PXA-B, the second pixel area PXA-R, and the third pixel area PXA-G may display lights of different wavelengths. The first pixel area PXA-B may display a first light of a blue wavelength, the second pixel area PXA-R may display a second light of a red wavelength, and the third pixel area PXA-G may display a third light of a green wavelength.

Meanwhile, each of the pixel areas PXA-B, PXA-R, and PXA-G may be distinguished from other pixel areas by the pixel definition layer PDL (refer to FIG. 6B). The non-pixel area NPXA may be defined between the pixel areas PXA-B, PXA-R, and PXA-G adjacent to each other and may correspond to the pixel definition layer PDL (refer to FIG. 6B). In the present disclosure, each of the pixel areas PXA-B, PXA-R, and PXA-G may correspond to the pixel. The pixel areas PXA-B, PXA-R, and PXA-G may be distinguished from each other to correspond to the pixel opening OP (refer to FIG. 6B) defined through the pixel definition layer PDL (refer to FIG. 6B).

As shown in FIG. 7A, a plurality of the first pixel area PXA-B may be arranged in the second direction DR2 to form a first pixel group, and a plurality of the second pixel area PXA-R and a plurality of the third pixel area PXA-G may be alternately arranged in the second direction DR2 to form a second pixel group. The first pixel group including a plurality of the first pixel area PXA-B and the second pixel group including a plurality of the second pixel area PXA-R and a plurality of the third pixel area PXA-G may be spaced apart from each other in first direction DR1. The first pixel group and the second pixel group may be alternately arranged with each other in the first direction DR1.

The pixel areas PXA-B, PXA-R, and PXA-G may have different sizes from each other depending on wavelengths of the lights emitted therefrom. As an example, as shown in FIG. 7A, the first pixel area PXA-B emitting the first light may have the largest size, and the second pixel area PXA-R emitting the second light may have the smallest size, however, the present disclosure should not be limited thereto or thereby. According to an embodiment, the pixel areas PXA-B, PXA-R, and PXA-G may have the same size as each other, or the pixel areas PXA-B, PXA-R, and PXA-G may be defined with an area ratio different from that shown in FIG. 7A. The pixel areas PXA-B, PXA-R, and PXA-G may emit lights of other colors in addition to the blue wavelength light, the red wavelength light, and the green wavelength light.

Each of the pixel areas PXA-B, PXA-R, and PXA-G may have a rectangular shape with rounded corners. First pixel area PXA-B may have the rectangular shape defined by long sides extending in the second direction DR2 and short sides extending in the first direction DR1 and provided with rounded corners. Each of the second pixel area PXA-R and the third pixel area PXA-G may have the rectangular shape defined by long sides extending in the first direction DR1 and short sides extending in the second direction DR2 and provided with rounded corners.

Meanwhile, the first convex portion CVP1 may be defined in the pixel definition layer PDL (refer to FIG. 6B). The first convex portion CVP1 may have a shape protruding from an upper surface of the pixel definition layer PDL (refer to FIG. 6B) to a thickness direction of the pixel definition layer PDL (refer to FIG. 6B) when viewed in a cross-section. The shape of the first convex portion CVP1 will be described in detail later.

According to the display device, the first convex portion CVP1 may be defined to surround a portion of each pixel area PXA to prevent a lateral leakage current from occurring between the pixels adjacent to each other. Meanwhile, in the present disclosure, the expression "lateral leakage current" indicates a current flowing in a direction that intersects the third direction DR3 rather than a current flowing in the third direction DR3 that corresponds to the stacking direction of the light emitting element, i.e., the direction to which the image is displayed. The lateral leakage current may indicate the current flowing in the direction substantially parallel to a plane defined by the first direction DR1 and the second direction DR2.

Figure 7B:
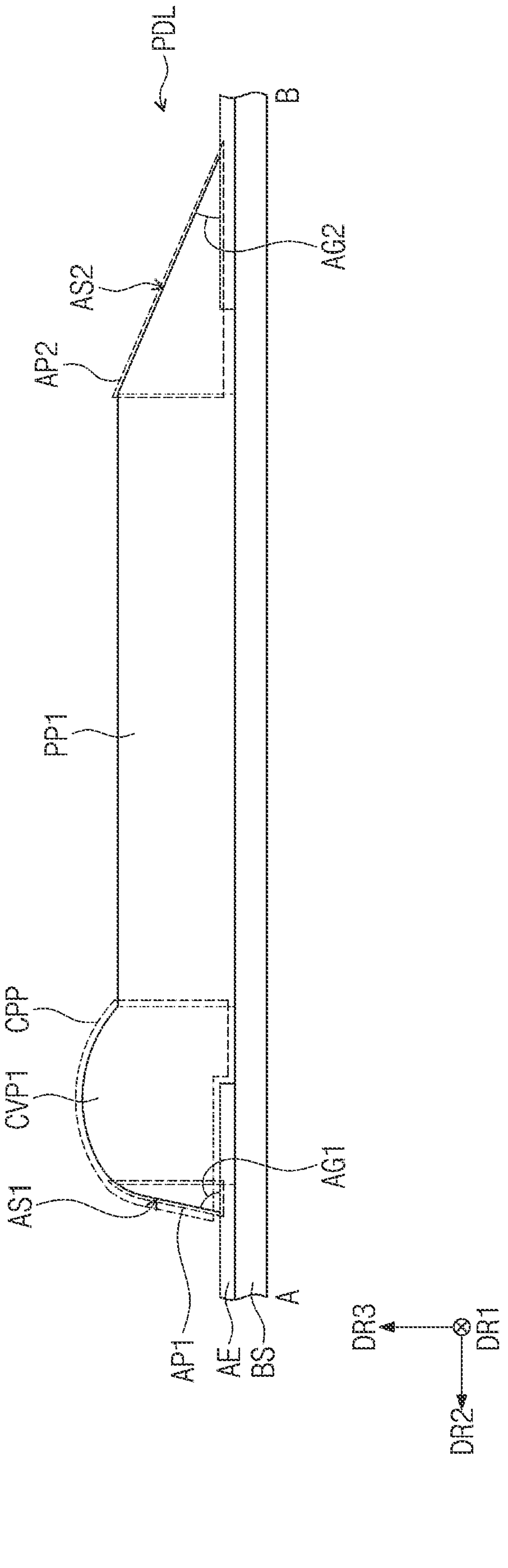
FIGS. 7B, 7C, and 7D are cross-sectional views of portions of display panels according to embodiments of the present disclosure.

Referring to FIGS. 7A and 7B, the first convex portion CVP1 may be defined in the display device along the thickness direction of the pixel definition layer PDL.

According to an embodiment, a closed portion CPP may be defined in the pixel definition layer to overlap the non-pixel area NPXA and to surround a portion of each of the pixel areas PXA-B, PXA-R, and PXA-G. The closed portion CPP may include the first convex portion CVP1. The closed portion CPP may surround the portion of each of the pixel areas PXA-B, PXA-R, and PXA-G and may not surround the other portion of each of the pixel areas PXA-B, PXA-R, and PXA-G. The closed portion CPP may include a first closed portion CPP1 surrounding the portion of the first pixel area PXA-B, a second closed portion CPP2 surrounding the portion of the second pixel area PXA-R, and a third closed portion CPP3 surrounding the portion of the third pixel area PXA-G. In the present disclosure, the other portion of each of the pixel areas PXA-B, PXA-R, and PXA-G, which is not surrounded by the closed portion CPP will be referred to as an opened portion OPP.

The opened portion OPP may include a first opened portion OPP1 surrounding a portion of the first pixel area PXA-B, a second opened portion OPP2 surrounding a portion of the second pixel area PXA-R, and a third opened portion OPP3 surrounding a portion of the third pixel area PXA-G. The ratio of a length of the opened portion OPP to a total length including the length of the opened portion OPP and a length of the closed portion CPP in a specific pixel area may be defined as a cathode open ratio (%). As an example, when a sum of a length of the first opened portion OPP1 and a length of the first closed portion CPP1 is five times greater than the length of the first opened portion OPP1 in the first pixel area PXA-B, the cathode open ratio may be about 20%.

Meanwhile, the cathode open ratio (%) may be within a range from about 20% or more to about 30% or less, however, this is merely example. In a case where the cathode open ratio (%) is smaller than about 20%, the driving voltage excessively increases, and thus, an efficiency of the display device may be lowered. In a case where the cathode open ratio (%) is greater than about 30%, the lateral leakage current is excessively generated. As a result, the color mixture may occur between the pixels adjacent to each other, and thus, optical characteristics of the display device may be deteriorated.

According to the display device, the opened portions OPP1, OPP2, and OPP3 may be arranged not to face each other. In a case where the opened portions OPP1, OPP2, and OPP3 are defined to face each other, the lateral leakage current may occur between the pixels, which are adjacent to each other, in which the opened portions OPP1, OPP2, and OPP3 are defined to face each other. However, since the opened portions OPP1, OPP2, and OPP3 are arranged not to face each other in the display device according to the present disclosure, the current may be prevented from flowing in a direction along the plane defined by the first direction DR1 and the second direction DR2 other than an intended direction. Accordingly, the increase of a driving voltage of the display device, the occurrence of the color mixture between the pixels adjacent to each other, and the deterioration of the brightness may be prevented, and thus, a display efficiency of the display device may be improved.

Each of the pixel areas PXA-B, PXA-R, and PXA-G may be spaced apart from the pixel area adjacent thereto by a distance of about 20 micrometers, however, this is merely an example.

Figure 7C:
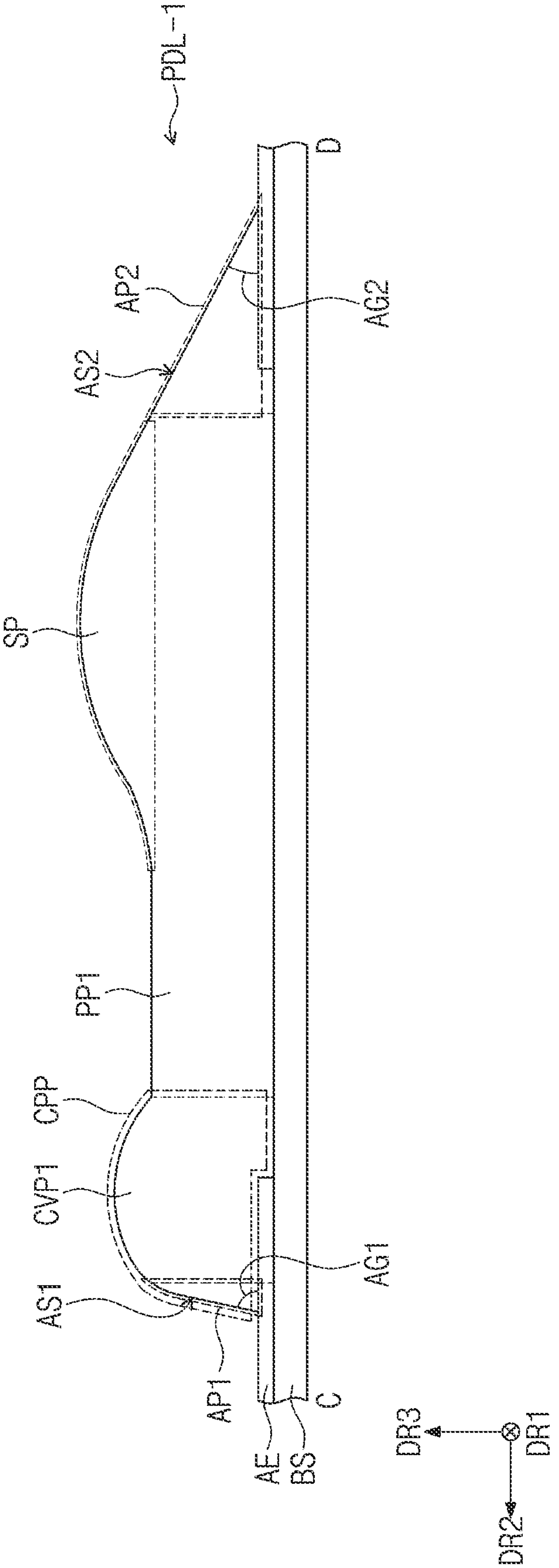
Figure 7D:
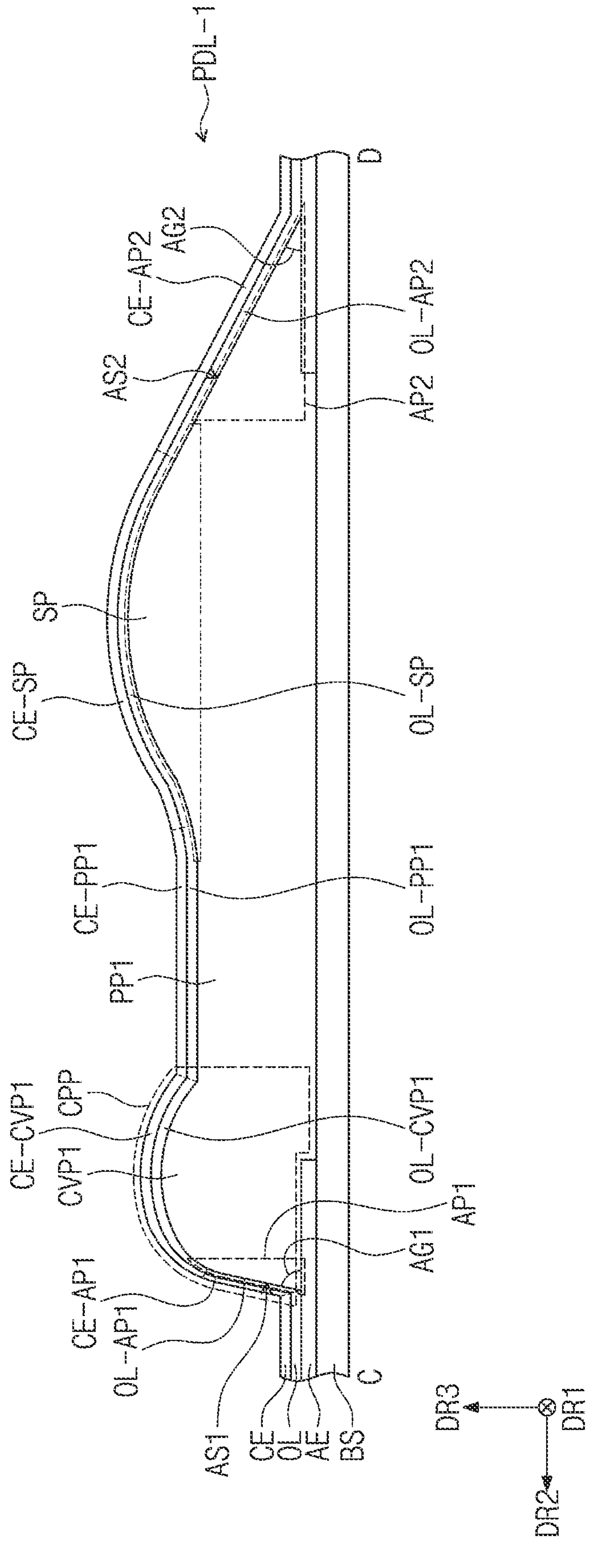

FIGS. 7B to 7D are cross-sectional views of portions of display panels according to embodiments of the present disclosure.

FIG. 7B shows a cross-section of the display panel taken along a line A-B shown in FIG. 7A, and FIG. 7C shows a cross-section of the display panel taken along a line C-D shown in FIG. 7A. FIG. 7D shows a portion of a display panel further including an organic layer OL and a second electrode CE according to an embodiment of the present disclosure when compared with the embodiment shown in FIG. 7B. Hereinafter, the portion of the display panel of FIG. 7A when viewed in a cross-section will be mainly described with reference to FIGS. 7B to 7D.

Referring to FIGS. 7A and 7B, the base layer BS may include the first pixel area PXA-B and the second pixel area PXA-R adjacent to the first pixel area PXA-B, the pixel definition layer PDL may be disposed on the base layer BS and provided with the pixel opening OP (refer to FIG. 6B) defined therethrough to correspond to each of the first pixel area PXA-B and the second pixel area PXA-R, and at least a portion of the first electrode AE may be disposed in the pixel opening OP. In FIG. 7B as well as FIGS. 7C, 7D, 8B, 8C, 9, and 11B, the circuit element layer DP-CL is not shown but may be disposed between the base layer BS and the first electrode AE as well as between the base layer BS and the pixel definition layer PDL, PDL-1, PDL-2, and PDL-3 (see FIG. 6B).

An upper surface of the base layer BS may be substantially parallel to an upper surface of the first electrode AE.

The pixel definition layer PDL-1 may be disposed on the base layer BS. The pixel definition layer PDL-1 may include a first slant portion AP1, a second slant portion AP2, the first convex portion CVP1, and a first flat portion PP1. The first slant portion AP1 may include a first slant surface AS1 inclined at a first angle AG1 with respect to the upper surface of the base layer BS.

The second slant portion AP2 may be spaced apart from the first slant portion AP1. The second slant portion AP2 may include a second slant surface AS2 inclined at a second angle AG2 with respect to the upper surface of the base layer BS, and the first angle AG1 may be greater than the second angle AG2.

In a case where the angles AG1 and AG2 of the slant surfaces AS1 and AS2 with respect to the upper surface of the base layer BS are greater than about 130°, a damage, such as cracks, may be generated in the upper insulating layer TFL (refer to FIG. 6A) disposed thereabove. In addition, in a case where the angles AG1 and AG2 of the slant surfaces AS1 and AS2 with respect to the upper surface of the base layer BS are smaller than about 10°, an area for the pixel definition layer PDL may be unnecessarily large because an excessively large area is required to place the pixel definition layer PDL, and thus, the display efficiency may be deteriorated. As an example, the first angle AG1 may be equal to or greater than about 70° and equal to or less than about 130°, and the second angle AG2 may be equal to or greater than about 10° and equal to or less than about 40°, however, the present disclosure should not be limited thereto or thereby.

The first convex portion CVP1 may be disposed between the first slant portion AP1 and the second slant portion AP2 and may be disposed adjacent to the first slant portion AP1. The first flat portion PP1 may be disposed between the first slant portion AP1 and the second slant portion AP2 and may be disposed adjacent to the second slant portion AP2. The first convex portion CVP1 may be disposed between the first slant portion AP1 and the first flat portion PP1. The first flat portion PP1 may be disposed between the first convex portion CVP1 and the second slant portion AP2. An upper surface of the first flat portion PP1 may be substantially parallel to the upper surface of the base layer BS.

A step difference between the first convex portion CVP1 and the first flat portion PP1 may be equal to or greater than about 0.2 μm and equal to or less than about 1.0 μm. That is, a distance between an upper surface of the first convex portion CVP1 and the upper surface of the base layer BS in the thickness direction may be greater by about 0.2 micrometers or more and about 1.0 micrometers or less compared to a distance between the upper surface of the first flat portion PP1 and the upper surface of the base layer BS. Meanwhile, in the present disclosure, the step difference between the first convex portion CVP1 and the first flat portion PP1 may be defined as a difference between the upper surface of the first flat portion PP1 and a portion which is the most protruded in the upper surface of the first convex portion CVP1. The first convex portion CVP1 may have a width equal to or greater than about 2.5 μm and equal to or less than about 4.5 μm, however, the present disclosure should not be limited thereto or thereby.

Referring to FIG. 7C, the pixel definition layer PDL-1 may further include a spacer SP. The spacer SP may be disposed on a first flat portion PP1. The spacer SP may function to maintain an appropriate distance between a layer, which may be placed on the pixel definition layer PDL-1, for example, the organic layer OL (refer to FIG. 7D) or the second electrode CE (refer to FIG. 7D), and the first electrode AE.

Referring to FIG. 7D, different from the structure shown in FIG. 7C, the display panel may further include the organic layer OL disposed on a first electrode AE and a pixel definition layer PDL-1 and a second electrode CE disposed on the organic layer OL.

The organic layer OL may include at least the light emitting layer EML (refer to FIG. 6B). The organic layer OL may include an organic first slant portion OL-AP1 disposed on the first slant surface AS1, an organic first convex portion OL-CVP1 disposed on a first convex portion CVP1, an organic first flat portion OL-PP1 disposed on a first flat portion PP1, an organic spacer portion OL-SP disposed on a spacer SP, and an organic second slant portion OL-AP2 disposed on the second slant surface AS2, and the second electrode CE may include an electrode first slant portion CE-AP1 disposed on the organic first slant portion OL-AP1, an electrode first convex portion CE-CVP1 disposed on the organic first convex portion OL-CVP1, an electrode first flat portion CE-PP1 disposed on the organic first flat portion OL-PP1, an electrode spacer portion CE-SP disposed on the organic spacer portion OL-SP, and an electrode second slant portion CE-AP2 disposed on the organic second slant portion OL-AP2.

The organic first slant portion OL-AP1 may have a thickness smaller than a thickness of the organic first flat portion OL-PP1 or the organic second slant portion OL-AP2.

The thickness of the organic first slant portion OL-AP1 may be about 10% or more and about 30% or less of the thickness of the organic first flat portion OL-PP1 or the organic second slant portion OL-AP2. In detail, the thickness of the organic first slant portion OL-AP1 may be about 10% or more or about 30% or less of the thickness of the organic first flat portion OL-PP1. The thickness of the organic first slant portion OL-AP1 may be about 10% or more and about 30% or less of the thickness of the organic second slant portion OL-AP2.

The organic first convex portion OL-CVP1, the organic first flat portion OL-PP1, the organic spacer portion OL-SP, and the organic second slant portion OL-AP2 may have substantially the same thickness as each other. The electrode first convex portion CE-CVP1, the electrode first flat portion CE-PP1, the electrode spacer portion CE-SP, and the electrode second slant portion CE-AP2 may have substantially the same thickness as each other, however, the present disclosure should not be limited thereto or thereby.

In a case where the thickness of the organic first slant portion OL-AP1 is smaller than about 10% of the thickness of the organic first flat portion OL-PP1 or the organic second slant portion OL-AP2, the organic first slant portion OL-AP1 with the above-described thickness may be difficult to implement in terms of manufacturing process. In a case where the thickness of the organic first slant portion OL-AP1 is greater than about 30% of the thickness of the organic first flat portion OL-PP1 or the organic second slant portion OL-AP2, the current may be leaked to the lateral side through the organic first slant portion OL-AP1, and the brightness may be lowered.

When the angle between the first slant surface AS1 and the upper surface of the base layer BS is equal to or greater than about 70°, it is difficult for the current to flow through the organic first slant portion OL-AP1 since the thickness of the organic first slant portion OL-AP1 is relatively thin compared with that when the angle between the first slant surface AS1 and the upper surface of the base layer BS is smaller than about 40°. As a result, the lateral leakage current may be prevented from being generated, and the occurrence of the color mixture between the pixel areas adjacent to each other and the deterioration of the brightness may be prevented.

Figure 8A:
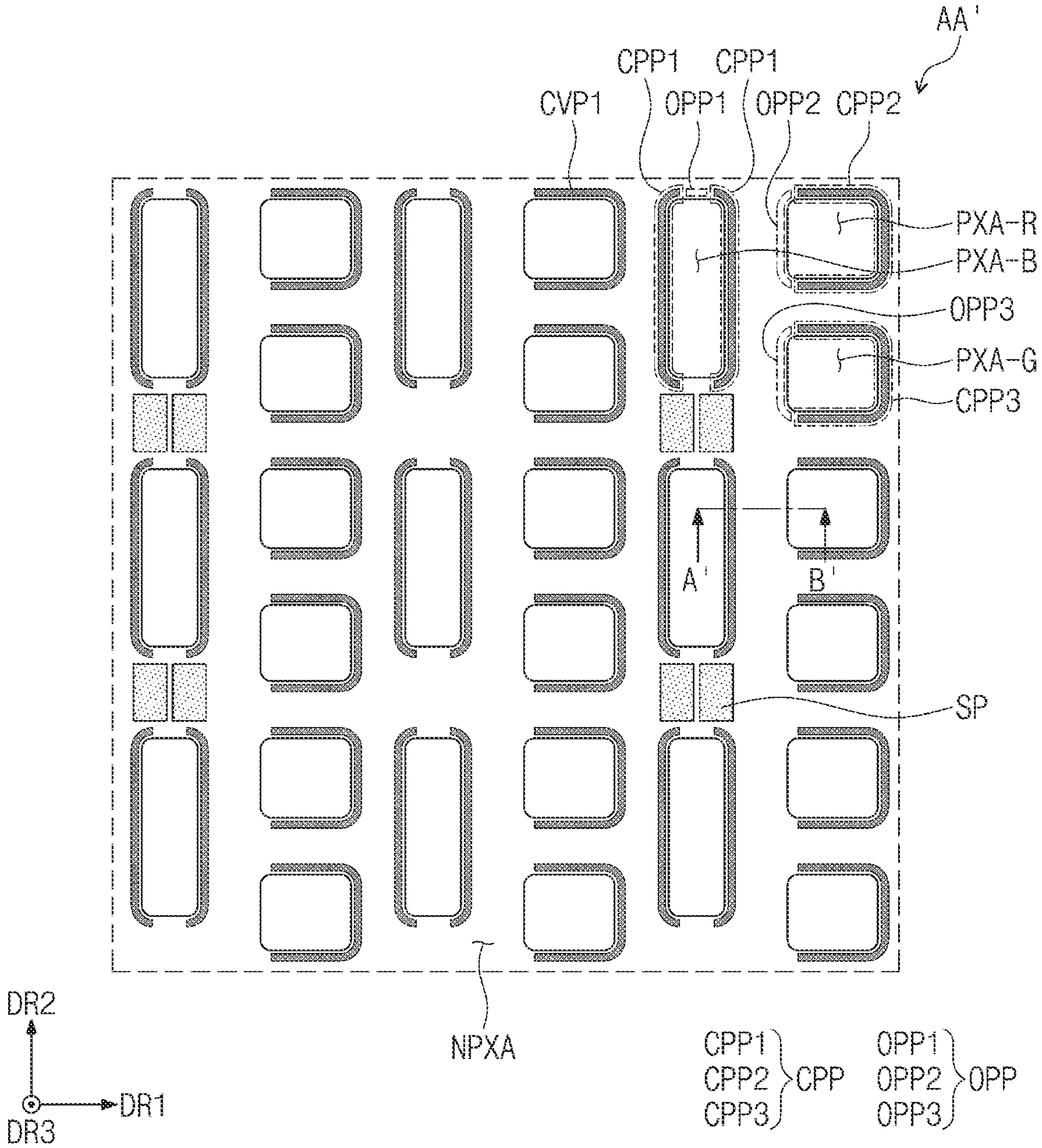
FIG. 8A is a plan view of a portion of a display panel according to an embodiment of the present disclosure.
Figure 8B:
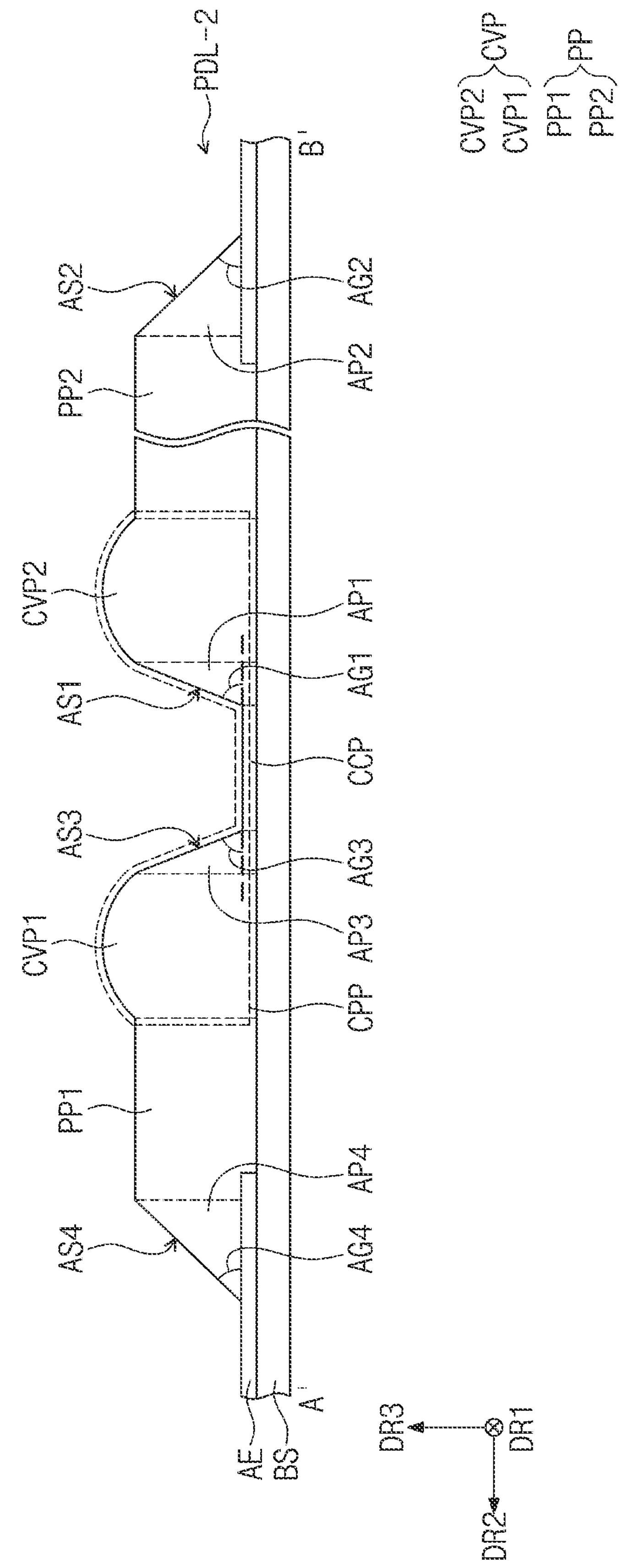
FIG. 8B is a cross-sectional view of a portion of a display panel according to an embodiment of the present disclosure.

FIG. 8A is a plan view of a portion of a display panel according to an embodiment of the present disclosure. FIG. 8B is a cross-sectional view of the portion of the display panel according to an embodiment of the present disclosure. FIG. 8B shows a cross-section taken along a line A'-B' of FIG. 8A.

Referring to FIGS. 8A and 8B, different from the pixel definition layer PDL shown in FIG. 7B, a pixel definition layer PDL-2 may further include a second convex portion CVP2 adjacent to a first slant surface AS1.

A closed portion CPP may be defined in each of the pixel areas PXA-B, PXA-R, and PXA-G to overlap a non-pixel area NPXA and to surround a portion of each of the pixel areas PXA-B, PXA-R, and PXA-G. The closed portion CPP may include a portion of the first convex portion CVP1 and a portion of the second convex portion CVP2. The closed portion CPP may surround the portion of each of the pixel areas PXA-B, PXA-R, and PXA-G and may not surround the other portion of each of the pixel areas PXA-B, PXA-R, and PXA-G. The closed portion CPP may include a first closed portion CPP1 surrounding a portion of a first pixel area PXA-B, a second closed portion CPP2 surrounding a portion of a second pixel area PXA-R, and a third closed portion CPP3 surrounding a portion of a third pixel area PXA-G.

In the present disclosure, a portion of each of the pixel areas PXA-B, PXA-R, and PXA-G, which is not surrounded by the closed portion CPP, will be referred to as an opened portion OPP. The opened portion OPP may include a first opened portion OPP1 surrounding a portion of the first pixel area PXA-B, a second opened portion OPP2 surrounding a portion of the second pixel area PXA-R, and a third opened portion OPP3 surrounding a portion of the third pixel area PXA-G. The ratio of a length of the opened portion OPP to a total length including the length of the opened portion OPP and a length of the closed portion CPP in a specific pixel area may be defined as a cathode open ratio (%). As an example, when a sum of a length of the first opened portion OPP1 and a length of the first closed portion CPP1 is five times greater than the length of the first opened portion OPP1 in the first pixel area PXA-B, the cathode open ratio may be about 20%.

Meanwhile, the cathode open ratio (%) may be within a range from about 20% or more to about 30% or less, however, this is merely example. In a case where the cathode open ratio (%) is smaller than about 20%, the driving voltage excessively increases, and thus, an efficiency of the display device may be lowered. In a case where the cathode open ratio (%) is greater than about 30%, the lateral leakage current is excessively generated. As a result, the color mixture may occur between the pixels adjacent to each other, and thus, optical characteristics of the display device may be deteriorated.

A base layer BS may include the first pixel area PXA-B and the second pixel area PXA-R adjacent to the first pixel area PXA-B, a pixel definition layer PDL-2, which is provided with a pixel opening OP corresponding to each of the first pixel area PXA-B and the second pixel area PXA-R, may be disposed on the base layer BS, and at least a portion of a first electrode AE may be disposed in the pixel opening OP.

The pixel definition layer PDL-2 may be disposed on the pixel areas PXA-B, PXA-R, and PXA-G and the base layer BS and may include a first slant portion AP1, a second slant portion AP2, a first convex portion CVP1, and a first flat portion PP1.

The first slant portion AP1 may include the first slant surface AS1 inclined at a first angle AG1 with respect to an upper surface of the base layer BS.

The second slant portion AP2 may include a second slant surface AS2 spaced apart from the first slant portion AP1 and inclined at a second angle AG2 with respect to the upper surface of the base layer BS.

The third slant portion AP3 may face the first slant portion AP1. The pixel definition layer PDL-2 may further include a third slant surface AS3 inclined at a third angle AG3 with respect to the upper surface of the base layer BS.

The pixel definition layer PDL-2 may further include a concave portion CCP disposed between the first slant portion AP1 and a third slant portion AP3. The upper surface of the base layer BS, the first electrode AE, and an upper surface of the concave portion CCP may be substantially parallel to each other.

The pixel definition layer PDL-2 may include a fourth slant portion AP4 spaced apart from the second slant portion AP2 with the first slant portion AP1 and the third slant portion AP3 interposed therebetween and including a fourth slant surface AS4 inclined at a fourth angle AG4 with respect to the base layer BS.

In a case where the angle between the slant surface AS1, AS2, AS3 and AS4 and the upper surface of the base layer BS is greater than about 130°, a damage, such as cracks, may be generated in the upper insulating layer TFL (refer to FIG. 6A) disposed thereabove. In addition, in a case where the angle between the slant surface AS1, AS2, AS3 and AS4 and the upper surface of the base layer BS is smaller than about 10°, an area for the pixel definition layer PDL-2 may be unnecessarily large because an excessively large area is required to place the pixel definition layer PDL-2, and thus, the display efficiency may be deteriorated. As an example, each of the first angle AG1 and the third angle AG3 may be equal to or greater than about 70° and equal to or less than about 130°, and each of the second angle AG2 and the fourth angle AG4 may be equal to or greater than about 10° and equal to or less than about 40°, however, the present disclosure should not be limited thereto or thereby.

The pixel definition layer PDL-2 may further include the second convex portion CVP2 disposed between the first slant portion AP1 and the second slant portion AP2. A separation distance between the first convex portion CVP1 and the second convex portion CVP2 may be equal to or greater than about 4 μm and equal to or less than about 6 μm, however, the present disclosure should not be limited thereto or thereby.

The pixel definition layer PDL-2 may further include a second flat portion PP2 disposed between the second convex portion CVP2 and the second slant surface AS2. An upper surface of the second flat portion PP2 may be substantially parallel to the upper surface of the base layer BS.

A step difference between the first convex portion CVP1 and the first flat portion PP1 may be equal to or greater than about 0.2 μm and equal to or less than about 1.0 μm. That is, a distance between an upper surface of the first convex portion CVP1 and the upper surface of the base layer BS in the thickness direction may be greater by about 0.2 micrometers or more and about 1.0 micrometers or less compared to a distance between the upper surface of the first flat portion PP1 and the upper surface of the base layer BS.

Each of the first convex portion CVP1 and the second convex portion CVP2 may have a width equal to or greater than about 2.5 μm and equal to or less than about 4.5 μm, however, the present disclosure should not be limited thereto or thereby.

Figure 8C:
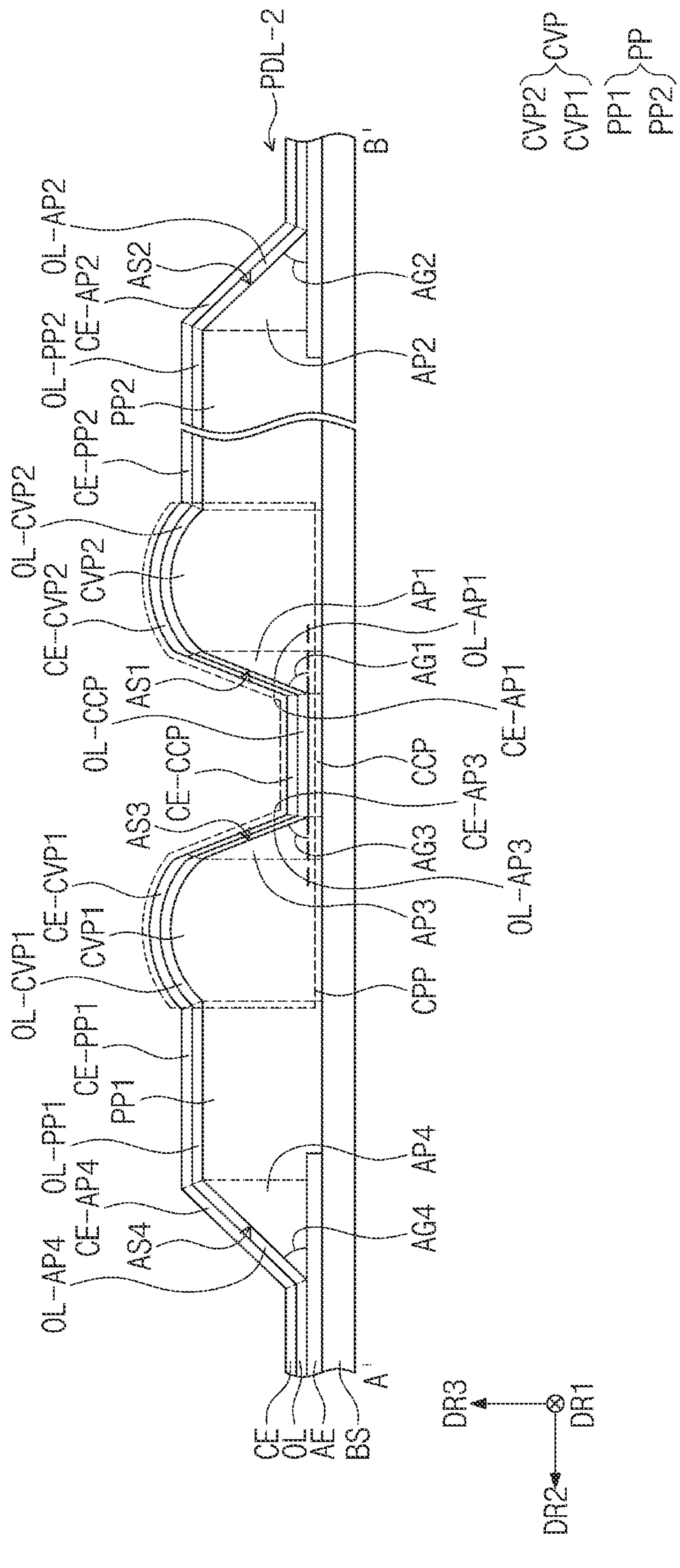
FIG. 8C is a cross-sectional view of a portion of a display panel according to an embodiment of the present disclosure.

FIG. 8C is a cross-sectional view of a portion of a display panel according to an embodiment of the present disclosure.

Referring to FIG. 8C, different from FIG. 8B, the display panel may further include an organic layer OL disposed on a first electrode AE and a pixel definition layer PDL-2 and a second electrode CE disposed on the organic layer OL.

The organic layer OL may include at least a light emitting layer EML (refer to FIG. 6B). The organic layer OL may include an organic fourth slant portion OL-AP4 disposed on a fourth slant surface AS4, an organic first flat portion OL-PP1 disposed on a first flat portion PP1, an organic first convex portion OL-CVP1 disposed on a first convex portion CVP1, an organic third slant portion OL-AP3 disposed on a third slant surface AS3, an organic concave portion OL-CCP disposed on a concave portion CCP, an organic first slant portion OL-AP1 disposed on a first slant surface AS1, an organic second convex portion OL-CVP2 disposed on a second convex portion CVP2, an organic second flat portion OL-PP2 disposed on a second flat portion PP2, and an organic second slant portion OL-AP2 disposed on a second slant surface AS2.

The second electrode CE may include an electrode fourth slant portion CE-AP4 disposed on the organic fourth slant portion OL-AP4, an electrode first flat portion CE-PP1 disposed on the organic first flat portion OL-PP1, an electrode first convex portion CE-CVP1 disposed on the organic first convex portion OL-CVP1, an electrode third slant portion CE-AP3 disposed on the organic third slant portion OL-AP3, an electrode concave portion CE-CCP disposed on the organic concave portion OL-CCP, an electrode first slant portion CE-AP1 disposed on the organic first slant portion OL-AP1, an electrode second convex portion CE-CVP2 disposed on the organic second convex portion OL-CVP2, an electrode second flat portion CE-PP2 disposed on the organic second flat portion OL-PP2, and an electrode second slant portion CE-AP2 disposed on the organic second slant portion OL-AP2.

The organic fourth slant portion OL-AP4, the organic first flat portion OL-PP1, the organic first convex portion OL-CVP1, the organic concave portion OL-CCP, the organic second convex portion OL-CVP2, the organic second flat portion OL-PP2, and the organic second slant portion OL-AP2 may have substantially the same thickness as each other.

The organic third slant portion OL-AP3 and the organic first slant portion OL-AP1 may have substantially the same thickness as each other.

The electrode fourth slant portion CE-AP4, the electrode first flat portion CE-PP1, the electrode first convex portion CE-CVP1, the electrode concave portion CE-CCP, the electrode second convex portion CE-CVP2, the electrode second flat portion CE-PP2, and the electrode second slant portion CE-AP2 may have substantially the same thickness as each other.

The electrode third slant portion CE-AP3 and the electrode first slant portion CE-AP1 may have substantially the same thickness as each other.

The thickness of each of the organic third slant portion OL-AP3 and the organic first slant portion OL-AP1 may be smaller than the thickness of the organic first flat portion OL-PP1 or the organic second flat portion OL-PP2.

The thickness of each of the organic third slant portion OL-AP3 and the organic first slant portion OL-AP1 may be about 10% or more and about 30% or less of the thickness of the organic first flat portion OL-PP1 or the organic second flat portion OL-PP2. That is, the thickness of the organic third slant portion OL-AP3 may be about 10% or more and about 30% or less of the thickness of the organic first flat portion OL-PP1 or the organic second flat portion OL-PP2, and the thickness of the organic first slant portion OL-AP1 may be about 10% or more and about 30% or less of the thickness of each of the organic first flat portion OL-PP1 or the organic second flat portion OL-PP2, however, the present disclosure should not be limited thereto or thereby.

In a case where the thickness of the organic third slant portion OL-AP3 is smaller than about 10% of the thickness of the organic first flat portion OL-PP1 or the organic second flat portion OL-PP2 and in a case where the thickness of the organic first slant portion OL-AP1 is smaller than about 10% of the thickness of the organic first flat portion OL-PP1 or the organic second flat portion OL-PP2, the organic third slant portion OL-AP3 and the organic first slant portion OL-AP1 with the above-described thickness may be difficult to implement in terms of manufacturing process.

In a case where the thickness of the organic third slant portion OL-AP3 is greater than about 30% of the thickness of the organic first flat portion OL-PP1 or the organic second flat portion OL-PP2 and the thickness of the organic first slant portion OL-AP1 is greater than about 30% of the thickness of the organic first flat portion OL-PP1 or the organic second flat portion OL-PP2, the current may leak to the lateral side through the organic third slant portion OL-AP3 or the organic first slant portion OL-AP1, and the brightness is lowered.

When an angle between the upper surface of the base layer BS and each of the first slant surface AS1 and the third slant surface AS3 is equal to or greater than about 70°, it is difficult for the current to flow through the second electrode CE since the thickness of the organic layer OL and the second electrode CE, which are disposed on the first slant surface AS1 and the third slant surface AS3, is relatively thin. As a result, the lateral leakage current may be prevented from being generated, and the occurrence of the color mixture between the pixel areas adjacent to each other and the deterioration of the brightness may be prevented.

Referring to FIGS. 7D and 8C, the organic layer OL and the second electrode CE are illustrated as having the same thickness, however, this is merely an example. According to an embodiment, the thickness of the second electrode CE may be greater than the thickness of the organic layer OL.

Figure 9:
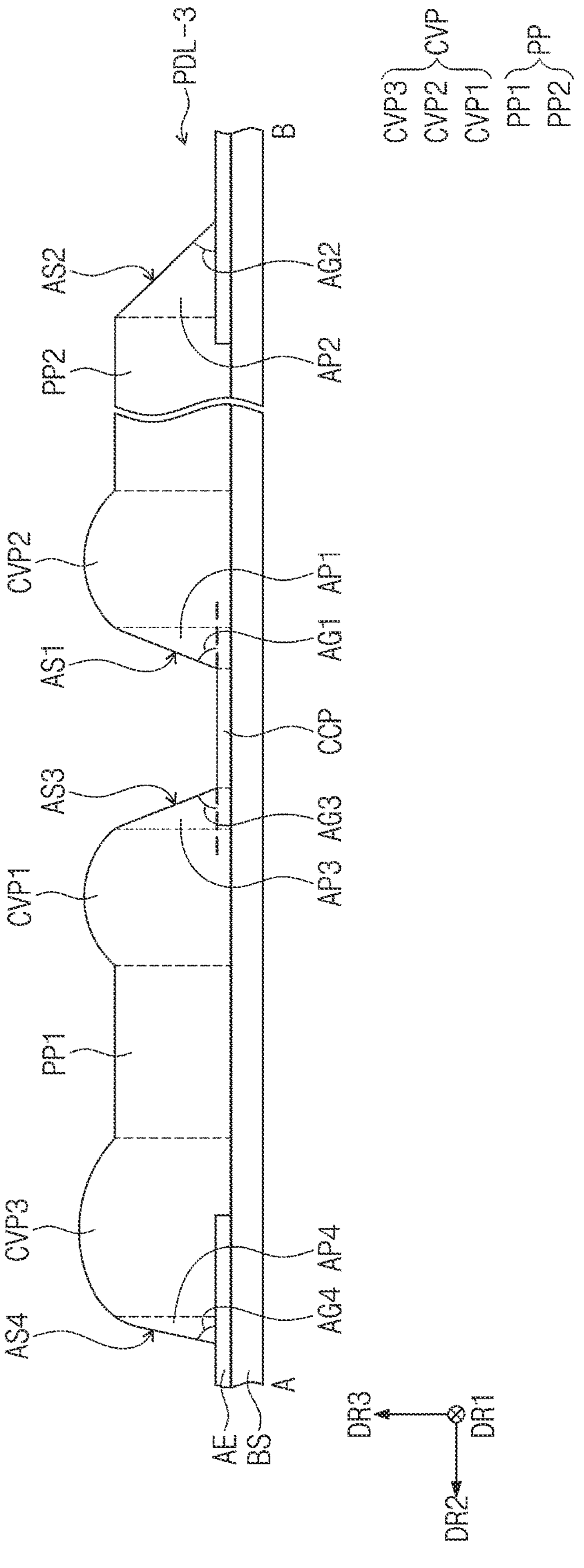
FIG. 9 is a cross-sectional view of a portion of a display panel according to an embodiment of the present disclosure.

FIG. 9 is a cross-sectional view of a portion of a display panel according to an embodiment of the present disclosure. In FIG. 9, features of the display panel different from those of the display panel of FIG. 8B will be mainly described.

Referring to FIG. 9, different from the display panel shown in FIG. 8B, the display panel of FIG. 9 may further include a third convex portion CVP3 disposed between a fourth slant surface AS4 and a first flat portion PP1.

Referring to FIG. 9, different from the fourth slant surface AS4 shown in FIG. 8B, a fourth angle AG4 between the fourth slant surface AS4 and an upper surface of the base layer BS may be greater than a second angle AG2.

In detail, each of a first angle AG1, a third angle AG3, and the fourth angle AG4 may be equal to or greater than about 70° and equal to or less than about 130°, and the second angle AG2 may be equal to or greater than about 10° and equal to or less than about 40°.

In a case where an angle between the slant surface AS1, AS2, AS3 and AS4 and the upper surface of the base layer BS is greater than about 130°, a damage, such as cracks, may be generated in the upper insulating layer TFL (refer to FIG. 6A) disposed thereabove. In addition, in a case where the angle between the slant surface AS1, AS2, AS3 and AS4 and the upper surface of the base layer BS is smaller than about 10°, an area for the pixel definition layer PDL-3 may be unnecessarily large because an excessively large area is required to dispose the pixel definition layer PDL-3, and thus, the display efficiency may be deteriorated.

Figure 10:
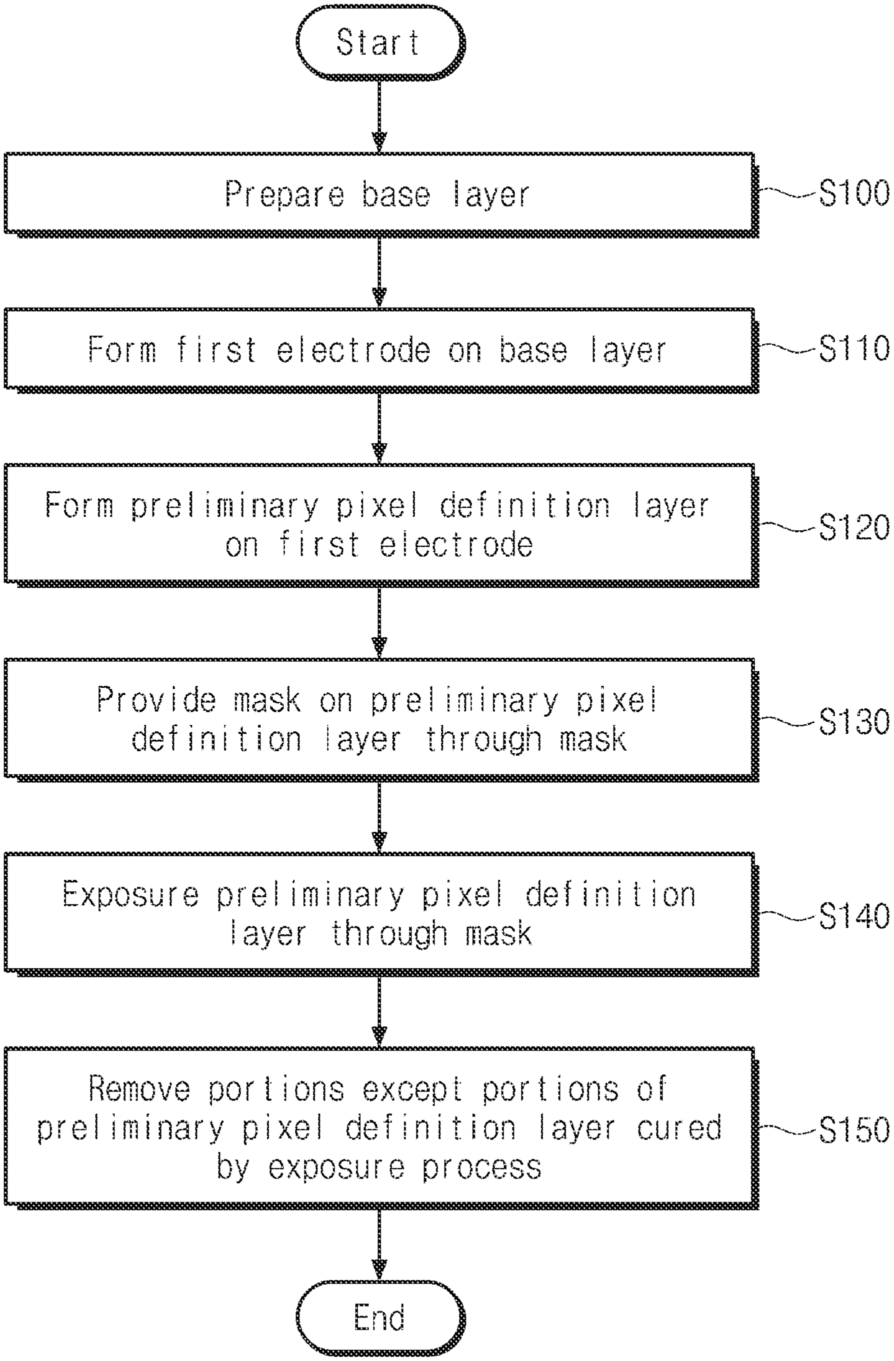
FIG. 10 is a flowchart illustrating a method of manufacturing a display panel according to an embodiment of the present disclosure.

FIG. 10 is a flowchart illustrating a method of manufacturing the display panel according to an embodiment of the present disclosure.

Figure 11A:
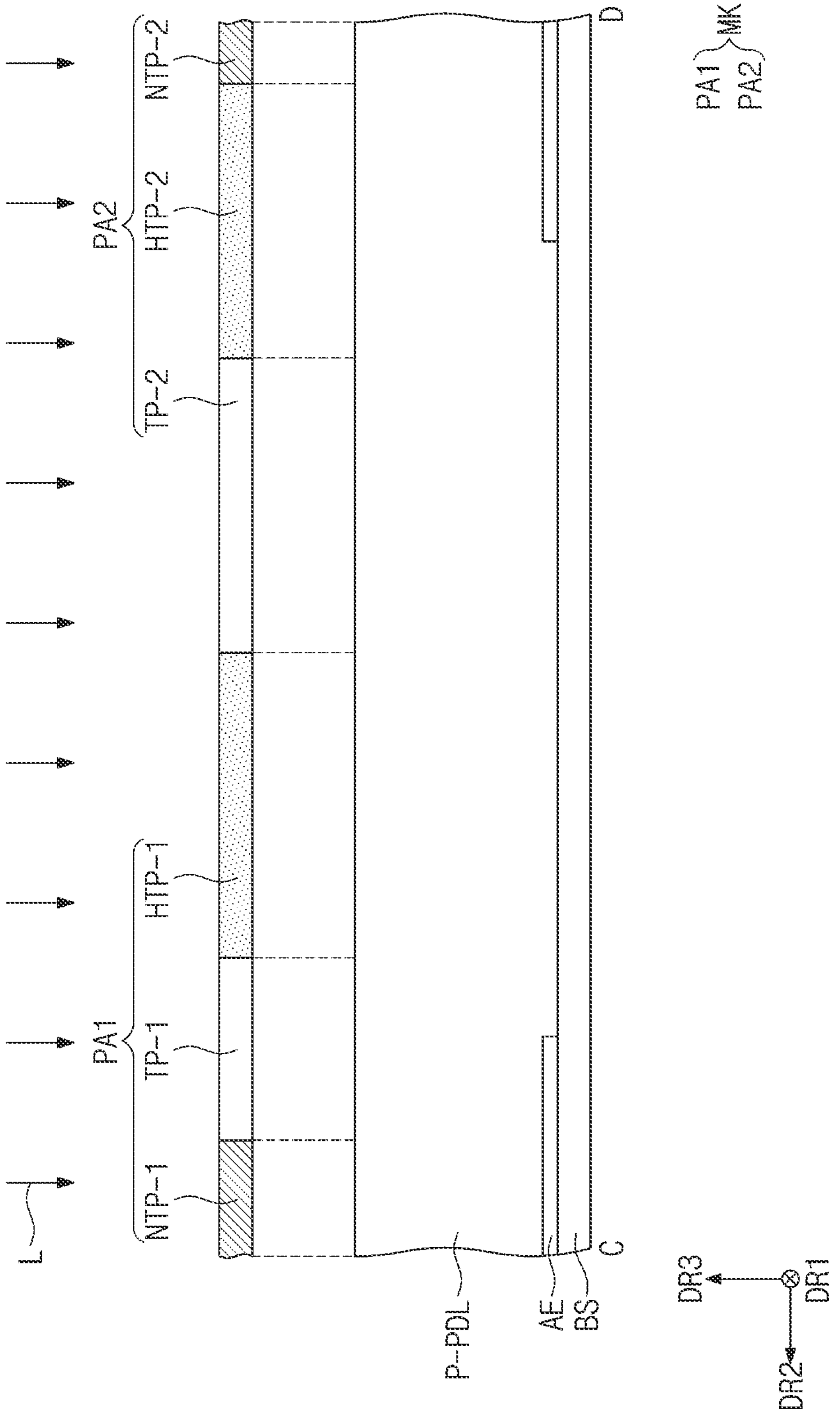
FIGS. 11A and 11B are cross-sectional views illustrating processes of the manufacturing method of the display panel according to an embodiment of the present disclosure.
Figure 11B:
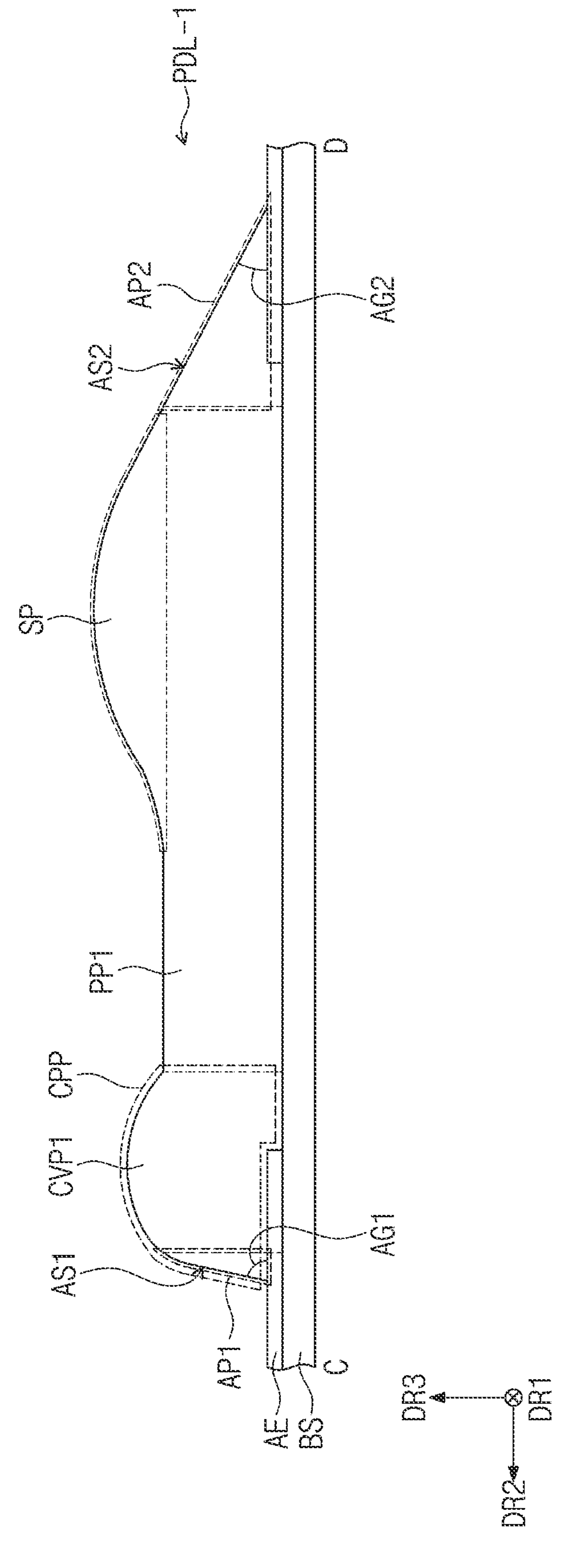

FIGS. 11A and 11B are cross-sectional views illustrating processes of the manufacturing method of the display panel according to an embodiment of the present disclosure.

Referring to FIGS. 10, 11A, and 11B, the processes of the manufacturing method of the display panel may include preparing the base layer BS (S100), forming the first electrode AE on the base layer BS (S110), providing a negative photoresist covering the first electrode AE to form a preliminary pixel definition layer P-PDL (S120), providing a mask including a first portion PA1 in which a first exposure non-transmissive portion NTP-1, a first exposure transmissive portion TP-1, and a first exposure semi-transmissive portion HTP-1 are arranged in one direction and a second portion PA2 in which a second exposure transmissive portion TP-2, a second exposure semi-transmissive portion HTP-2, and a second exposure non-transmissive portion NTP-2 are arranged in the one direction on the preliminary pixel definition layer P-PDL (S130), exposing the preliminary pixel definition layer P-PDL to a light through the mask (S140), and removing portions of the preliminary pixel definition layer P-PDL except portions cured by the exposure process using the mask to form the pixel definition layer PDL (S150).

Meanwhile, although not shown in figures, the manufacturing method of the display panel may further include removing the mask after the forming of the pixel definition layer.

Referring to FIGS. 11A and 11B, the manufacturing method of the display panel may include forming the first electrode AE on the base layer BS and forming the preliminary pixel definition layer P-PDL on the first electrode AE and the base layer BS after the forming of the first electrode AE. The preliminary pixel definition layer P-PDL may be formed to cover the first electrode AE. The preliminary pixel definition layer P-PDL may be formed using the negative photoresist.

The manufacturing method of the display panel may include the providing of the mask MK above the preliminary pixel definition layer P-PDL. The mask MK may include the first portion PA1 in which the first exposure non-transmissive portion NTP-1, the first exposure transmissive portion TP-1, and the first exposure semi-transmissive portion HTP-1 are sequentially arranged along a direction opposite to the second direction DR2 and the second portion PA2 in which the second exposure transmissive portion TP-2, the second exposure semi-transmissive portion HTP-2, and the second exposure non-transmissive portion NTP-2 are sequentially arranged along the direction opposite to the second direction DR2.

After the providing of the mask MK, the manufacturing method of the display panel may include providing the light L onto the mask MK to expose the preliminary pixel definition layer P-PDL to the light L. The light L may be provided to the entire surface of the mask MK. That is, the light L may be provided to the first portion PA1 in which the first exposure non-transmissive portion NTP-1, the first exposure transmissive portion TP-1, and the first exposure semi-transmissive portion HTP-1 are sequentially arranged along the direction opposite to the second direction DR2 and the second portion PA2 in which the second exposure transmissive portion TP-2, the second exposure semi-transmissive portion HTP-2, and the second exposure non-transmissive portion NTP-2 are sequentially arranged along the direction opposite to the second direction DR2. In other words, the light L may be provided to the non-transmissive portions NTP-1 and NTP-2, the exposure transmissive portions TP-1 and TP-2, and the exposure semi-transmissive portions HTP-1 and HTP-2 included in the first portion PA1 and the second portion PA2.

After the exposure process, the portions of the preliminary pixel definition layer P-PDL, which is cured after being exposed to the light L in the manufacturing method of the display panel, may be formed as the pixel definition layer PDL-1. The manufacturing method of the display panel may include the removing of the portions of the preliminary pixel definition layer P-PDL, which are not cured.

The pixel definition layer PDL-1 may include the first slant portion AP1 formed corresponding to the first exposure non-transmissive portion NTP-1 included in the first portion PA1, the first convex portion CVP1 formed corresponding to the first exposure transmissive portion TP-1 included in the first portion PA1, the first flat portion PP1 formed corresponding to the first exposure semi-transmissive portion HTP-1 included in the first portion PA1, the spacer SP formed corresponding to the second exposure transmissive portion TP-2 included in the second portion PA2, and the second slant portion AP2 formed corresponding to the second exposure semi-transmissive portion HTP-2 included in the second portion PA2.

The first slant portion AP1 may include the first slant surface AS1 inclined at the first angle AG1 with respect to the upper surface of the base layer BS, and the second slant portion AP2 may include the second slant surface AS2 inclined at the second angle AG2 with respect to the upper surface of the base layer BS.

Figure 12A:
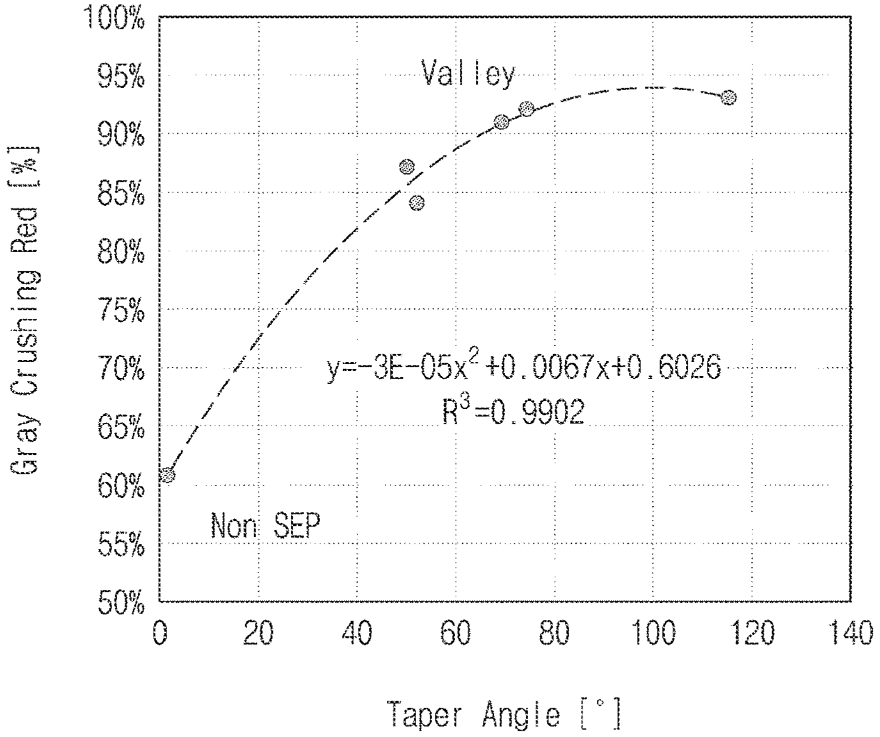
FIGS. 12A and 12B are graphs illustrating results of display quality test and variations in driving voltage of display panels according to an embodiment of the present disclosure and a comparative example.
Figure 12B:
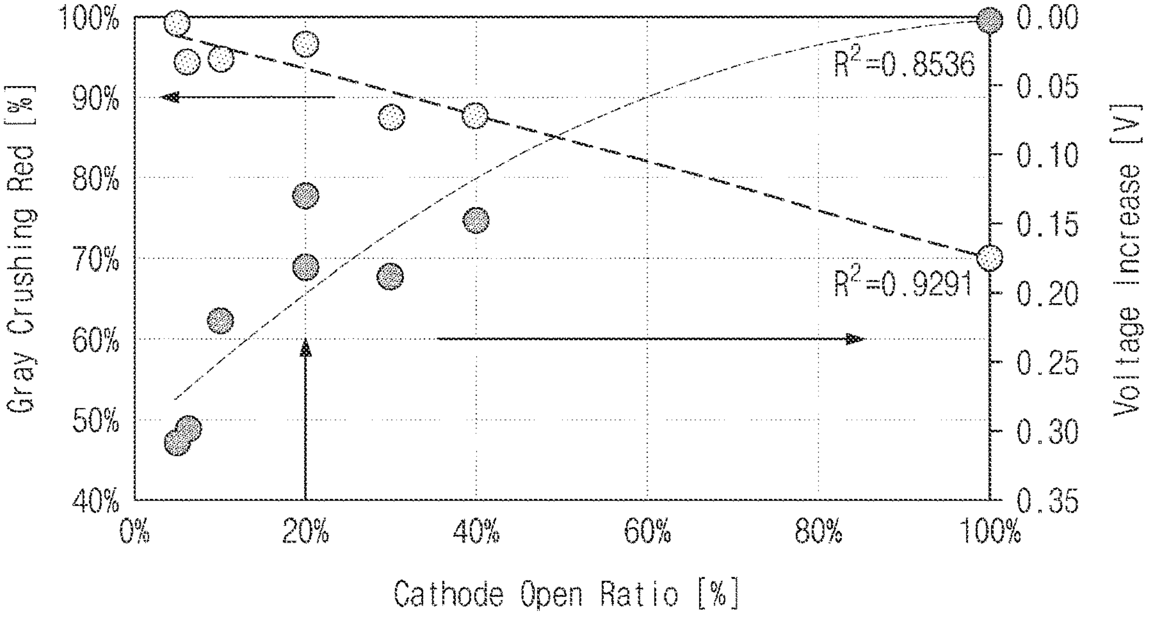

FIGS. 12A and 12B are graphs illustrating results of display quality test and variations in driving voltage of display panels according to an embodiment of the present disclosure and a comparative example.

FIG. 12A shows gray crushing red (%) according to taper angle (°), which is an angle between the slant surface AS1 and AS2 and the base layer BS, in the display panel DP according to an embodiment of the present disclosure. When the taper angle (°) is 0°, the slant surface is substantially parallel to the base layer BS. Referring to FIGS. 12A and 7A, the gray crushing red (%) indicates a relative brightness measured excluding a portion lost due to the lateral current leakage when a voltage is applied only to the first pixel area PXA-B. As an example, when the gray crushing red is about 90%, this means that the brightness is about 90% compared to the brightness of 100%, where there is no lateral current leakage in a condition that the voltage is applied only to the first pixel area PXA-B. The values of gray crushing red with respect to each taper angle of about 2°, 50°, 52°, 68°, 74°, and 115° were measured through a total of six experiments, and the results obtained by fitting the values of gray crushing red with a curve of y=−3E−0.5×2+0.0067x+0.6026 are shown in FIG. 12A.

Referring to FIG. 12A, when the display panel DP includes the slant surfaces formed adjacent to the pixel areas, it is observed that the value of the gray crushing red is improved until the taper angle reaches about 90°. Particularly, when the taper angle is about 70° or more, a brightness reduction rate is reduced to about 10% or less, and thus, it is observed that the value of the gray crushing red becomes significantly higher than that when the taper angle is close to 0°. Meanwhile, when the taper angle is greater than about 100°, the value of the gray crushing red starts to decrease, and when the taper angle is greater than about 130°, the damage, such as cracks, may be generated in the upper insulating layer TFL (refer to FIG. 6A). Accordingly, as the display panel DP according to the present disclosure includes the slant surface formed adjacent to the pixel areas and inclined at the predetermined angle with respect to the base layer BS, the display panel may have excellent optical properties. In particular, when the taper angle of the slant surface is equal to or greater than about 70° and equal to or less than about 130°, the optical properties may be more improved.

FIG. 12B shows the value of the gray crushing red (%) and a driving voltage increase amount according to the cathode open ratio (%) as a voltage increase (V) in the display panel DP according to the present disclosure. As an example, when the cathode open ratio (%) is about 0%, it means that only the closed portion CPP (refer to FIG. 7A) surrounds the pixel area, when the cathode open ratio (%) is about 100%, it means that only the opened portion OPP (refer to FIG. 7A) surrounds the pixel area, and when the voltage increase (V) is about 0.00 volts, it means that the driving voltage does not increase.

A graph of $R^2$=0.8536 represents a relationship of the voltage increase (V) to the cathode open ratio (%), and a graph of $R^2$=0.9291 represents the value of the gray crushing red (%) with respect to the cathode open ratio (%). A total of sixteen experiments were conducted, and in detail, eight experiments to measure the value of the gray crushing red (%) for each cathode open ratio % of about 4%, 5%, 10%, 20%, 30%, 40%, and 100% and eight experiments to measure the voltage increase (V) for each cathode open ratio % of about 4%, 5%, 10%, 20%, 30%, 40%, and 100% were conducted.

Referring to FIG. 12B, it is observed that as the value of the cathode open ratio (%) decreases in the display panel DP, the value of the gray crushing red (%) increases compared with when the cathode open ratio (%) increases.

According to the display panel DP, it is observed that as the value of the cathode open ratio (%) increases, the value of the voltage increase (V) is improved compared with when the value of the cathode open ratio (%) decreases.

That is, as the cathode open ratio (%) decreases, the value of the gray crushing red (%) is improved, but the value of the voltage increase (V) also increases, thereby deteriorating the efficiency.

In general, when the driving voltage (V) increases above 0.20 volts, the efficiency is not improved compared to the related art. Therefore, it is observed that a section where the voltage increase (V) has a value of about 0.20 voltage or less and the value of the gray crushing red (%) maintains about 90% or more is an optimal section, and this is the section in which the value of the cathode open ratio (%) is about 20% or more and about 30% or less.

Although the embodiments of the present disclosure have been described, it is understood that the present disclosure should not be limited to these embodiments but various changes and modifications can be made by one of ordinary skill in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:

1. A display panel comprising:

a base layer comprising a first pixel area and a second pixel area adjacent to the first pixel area;

a pixel definition layer disposed on the base layer and including a pixel opening defined therethrough to correspond to the first pixel area and the second pixel area, respectively;

a first electrode of which at least a portion is disposed in the pixel opening, wherein the pixel definition layer comprises:

a first slant portion;

a second slant portion spaced apart from the first slant portion;

a first convex portion disposed between the first slant portion and the second slant portion and adjacent to the first slant portion; and a first flat portion disposed between the first slant portion and the second slant portion and adjacent to the second slant portion, wherein the first slant portion comprises a first slant surface inclined at a first angle with respect to an upper surface of the base layer, the second slant portion comprises a second slant surface inclined at a second angle with respect to the upper surface of the base layer, and the first angle is greater than the second angle.

2. The display panel of claim 1, wherein the pixel definition layer comprises:

a first closed portion disposed along a periphery of the first pixel area, comprising the first convex portion, and surrounding a portion of the first pixel area; and a first opened portion that does not comprise the first convex portion and comprises a portion of the first pixel area, which is not surrounded by the first closed portion, and a circumference length of the first opened portion is about 20% or more and about 30% or less of a sum of the circumference length of the first opened portion and a circumference length of the first closed portion.

3. The display panel of claim 1, wherein the pixel definition layer further comprises a spacer disposed on the first flat portion.

4. The display panel of claim 1, wherein the first angle is equal to or greater than about 70° and equal to or less than about 130°, and the second angle is equal to or greater than about 10° and equal to or less than about 40°.

5. The display panel of claim 1, wherein a step difference between the first convex portion and the first flat portion is equal to or greater than about 0.2 micrometers and equal to or less than about 1.0 micrometers, and the first convex portion has a width equal to or greater than about 2.5 micrometers and equal to or less than about 4.5 micrometers.

6. The display panel of claim 1, wherein the base layer further comprises a third pixel area adjacent to the second pixel area, the first pixel area displays a first light, the second pixel area displays a second light having a wavelength different from the first light, and the third pixel area displays a third light having a wavelength different from the first light and the second light.

7. The display panel of claim 1, further comprising:

an organic layer disposed on the first electrode and the pixel definition layer and comprising a light emitting layer; and a second electrode disposed on the organic layer.

8. The display panel of claim 7, wherein the organic layer comprises:

an organic first slant portion disposed on the first slant surface;

an organic first convex portion disposed on the first convex portion;

an organic first flat portion disposed on the first flat portion; and an organic second slant portion disposed on the second slant surface, and the second electrode comprises:

an electrode first slant portion disposed on the organic first slant portion;

an electrode first convex portion disposed on the organic first convex portion;

an electrode first flat portion disposed on the organic first flat portion; and an electrode second slant portion disposed on the organic second slant portion.

9. The display panel of claim 8, wherein the organic first slant portion has a thickness of about 10% or more and about 30% or less of a thickness of the organic first flat portion or the organic second slant portion.

10. The display panel of claim 7, wherein the organic layer further comprises:

a hole control layer disposed on the first electrode and the pixel definition layer;

the light emitting layer disposed on the hole control layer; and an electron control layer disposed between the light emitting layer and the second electrode.

11. The display panel of claim 1, wherein the first slant portion is disposed adjacent to the first pixel area, and the second slant portion is disposed adjacent to the second pixel area.

12. The display panel of claim 1, wherein the pixel definition layer further comprises:

a third slant portion facing the first slant portion and comprising a third slant surface inclined at a third angle with respect to the upper surface of the base layer; and a fourth slant portion spaced apart from the second slant portion with the first slant portion and the third slant portion interposed therebetween and comprising a fourth slant surface inclined at a fourth angle with respect to the upper surface of the base layer, and the third angle is greater than the fourth angle.

13. The display panel of claim 12, wherein the third angle is equal to or greater than about 70° and equal to or less than about 130°, and the fourth angle is equal to or greater than about 10° and equal to or less than about 40°.

14. The display panel of claim 12, wherein the pixel definition layer further comprises a second convex portion disposed between the third slant portion and the fourth slant portion and adjacent to the third slant portion, and a separation distance between the first convex portion and the second convex portion is equal to or greater than about 4 micrometers and equal to or less than about 6 micrometers.

15. The display panel of claim 1, wherein the pixel definition layer further comprises:

a third slant portion facing the first slant portion and comprising a third slant surface inclined at a third angle with respect to the upper surface of the base layer; and a fourth slant portion spaced apart from the second slant portion with the first slant portion and the third slant portion interposed therebetween and comprising a fourth slant surface inclined at a fourth angle with respect to the upper surface of the base layer, and each of the third and fourth angles is greater than the second angle.

16. A display panel comprising:

a base layer comprising a first pixel area and a second pixel area adjacent to the first pixel area;

a pixel definition layer disposed on the base layer and including a pixel opening defined therethrough to correspond to the first pixel area and the second pixel area, respectively;

a first electrode of which at least a portion is disposed in the pixel opening; an organic layer disposed on the first electrode and the pixel definition layer and comprising a light emitting layer; and a second electrode disposed on the organic layer, wherein the pixel definition layer comprises:

a first slant portion comprising a first slant surface inclined at a first angle with respect to an upper surface of the base layer; and a second slant portion spaced apart from the first slant portion and comprising a second slant surface inclined at a second angle with respect to the upper surface of the base layer, wherein the first angle is greater than the second angle, the organic layer comprises an organic first slant portion disposed on the first slant surface and an organic second slant portion disposed on the second slant surface, the second electrode comprises an electrode first slant portion disposed on the organic first slant portion and an electrode second slant portion disposed on the organic second slant portion, and the organic first slant portion has a thickness smaller than a thickness of the organic second slant portion.

17. The display panel of claim 16, wherein the pixel definition layer further comprises a first convex portion disposed between the first slant portion and the second slant portion and adjacent to the first slant portion and a first flat portion disposed between the first slant portion and the second slant portion and adjacent to the second slant portion, the organic layer further comprises an organic first convex portion disposed on the first convex portion and an organic first flat portion disposed on the first flat portion, and the second electrode further comprises an electrode first convex portion disposed on the organic first convex portion and an electrode first flat portion disposed on the organic first flat portion.

18. The display panel of claim 17, wherein the organic first slant portion has a thickness of about 10% or more and about 30% or less of a thickness of the organic first flat portion or the organic second slant portion.

19. A method of manufacturing a display panel, comprising:

preparing a base layer;

forming a first electrode on the base layer;

providing a negative photoresist that covers the first electrode to form a preliminary pixel definition layer;

providing a mask comprising a first portion in which a first exposure non-transmissive portion, a first exposure transmissive portion, and a first exposure semi-transmissive portion are arranged in one direction and a second portion in which a second exposure transmissive portion, a second exposure semi-transmissive portion, and a second exposure non-transmissive portion are arranged in the one direction on the preliminary pixel definition layer;

exposing the preliminary pixel definition layer to a light through the mask; and removing portions of the preliminary pixel definition layer except portions cured by the exposure process to form the pixel definition layer, wherein the pixel definition layer comprises a first slant portion formed corresponding to the first exposure non-transmissive portion of the mask, a first convex portion formed corresponding to the first exposure transmissive portion of the mask, a first flat portion formed corresponding to the first exposure semi-transmissive portion of the mask, a spacer formed corresponding to the second exposure transmissive portion of the mask, and a second slant portion formed corresponding to the second exposure semi-transmissive portion of the mask, the first slant portion comprises a first slant surface inclined at a first angle with respect to an upper surface of the base layer, the second slant portion is spaced apart from the first slant portion and comprises a second slant surface inclined at a second angle with respect to the upper surface of the base layer, the first convex portion is disposed between the first slant portion and the second slant portion and disposed adjacent to the first slant portion, the first flat portion is disposed between the first slant portion and the second slant portion and disposed adjacent to the second slant portion, and the first angle is greater than the second angle.

20. The method of claim 19, wherein the first angle is equal to or greater than about 70° and equal to or less than about 130°, and the second angle is equal to or greater than about 10° and equal to or less than about 40°.

* * * * *